US012707681B2

(12) United States Patent
More et al.

(10) Patent No.: US 12,707,681 B2
(45) Date of Patent: Aug. 11, 2026

(54) MULTIGATE TRANSISTORS WITH CAPPING LAYERS AND A BUFFER LAYER COMPRISING GERMANIUM

(71) Applicant: Taiwan Semiconductor Manufacturing Company, Ltd., Hsinchu (TW)

(72) Inventors: Shahaji B. More, Hsinchu City (TW); Cheng-Han Lee, New Taipei City (TW); Shih-Chieh Chang, Taipei City (TW); Wan-Hsuan Hsieh, Hsinchu City (TW); Chung-En Tsai, Hsinchu County (TW); Chee-Wee Liu, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 994 days.

(21) Appl. No.: 17/673,400

(22) Filed: Feb. 16, 2022

(65) Prior Publication Data

US 2023/0054243 A1 Feb. 23, 2023

Related U.S. Application Data

(60) Provisional application No. 63/234,429, filed on Aug. 18, 2021.

(51) Int. Cl.

*H01L 23/498* (2006.01)
*G11C 5/06* (2006.01)
(Continued)

(52) U.S. Cl.

CPC ....... *H10D 30/6757* (2025.01); *H10D 30/031* (2025.01); *H10D 30/6713* (2025.01);
(Continued)

(58) Field of Classification Search

CPC ....... H10D 30/43–435; H10D 30/6757; H10D 30/6735; H10D 30/501–509;
(Continued)

(56) References Cited

U.S. PATENT DOCUMENTS 9,754,840 B2 9/2017 Lin et al.
9,818,872 B2 11/2017 Ching et al.
(Continued)

FOREIGN PATENT DOCUMENTS

CN 108206180 A * 6/2018 ..... H01L 21/823456
CN 109427900 A * 3/2019 ............ B82Y 10/00
(Continued)

*Primary Examiner* — Wael M Fahmy
*Assistant Examiner* — Aneesa Riaz Baig
(74) *Attorney, Agent, or Firm* — HAYNES AND BOONE, LLP

(57) ABSTRACT

The present disclosure provides a semiconductor structure and a method of forming the same. A semiconductor structure according to the present disclosure includes a plurality of nanostructures disposed over a substrate and a gate structure wrapping around each of the plurality of nanostructure. Each of the plurality of nanostructures includes a channel layer sandwiched between two cap layers along a direction perpendicular to the substrate.

20 Claims, 20 Drawing Sheets

(51) Int. Cl.

| | |
|---|---|
| ***H01L 21/768*** | (2006.01) |
| ***H01L 23/00*** | (2006.01) |
| ***H01L 23/495*** | (2006.01) |
| ***H10B 51/10*** | (2023.01) |
| ***H10B 51/20*** | (2023.01) |
| ***H10D 30/01*** | (2025.01) |
| ***H10D 30/47*** | (2025.01) |
| ***H10D 30/67*** | (2025.01) |
| ***H10D 62/10*** | (2025.01) |
| ***H10D 62/85*** | (2025.01) |
| ***H10D 64/01*** | (2025.01) |
| ***H10D 64/64*** | (2025.01) |
| ***H10H 20/852*** | (2025.01) |
| ***H10H 20/857*** | (2025.01) |
| ***H10P 14/20*** | (2026.01) |

(52) U.S. Cl.

CPC ....... *H10D 30/6735* (2025.01); *H10D 62/118* (2025.01); *H10D 64/017* (2025.01); *H10D 64/018* (2025.01); *H10P 14/3411* (2026.01); *H10P 14/3412* (2026.01); *H10P 14/3452* (2026.01)

(58) Field of Classification Search

CPC ..... H10D 30/014; H10D 30/019–0198; H10D 62/119–123; H10D 84/851; H10D 84/852; H10D 84/832; H10D 84/833; H10D 84/0128; H10D 84/0167; H10D 62/299–307; H10D 62/314; H10D 30/751; H10D 30/791–798; H01L 21/0245; H01L 21/02441; H01L 21/02532; H01L 21/02524

See application file for complete search history.

(56) References Cited

U.S. PATENT DOCUMENTS

| | | | | |
|---|---|---|---|---|
| 9,871,140 | B1 * | 1/2018 | Balakrishnan ....... | H10D 62/118 |
| 10,032,627 | B2 | 7/2018 | Lee et al. | |
| 10,290,546 | B2 | 5/2019 | Chiang et al. | |
| 10,475,902 | B2 | 11/2019 | Lee et al. | |
| 10,950,731 | B1 | 3/2021 | Peng et al. | |
| 11,031,292 | B2 | 6/2021 | Ju et al. | |
| 11,923,252 | B2 * | 3/2024 | Yeong ............... | H01L 29/66666 |
| 12,176,408 | B2 * | 12/2024 | Naskar ............... | H10D 30/6735 |
| 2014/0225065 | A1 * | 8/2014 | Rachmady ........... | H10D 62/235<br>438/283 |
| 2017/0141188 | A1 * | 5/2017 | Lee ...................... | H10D 30/014 |
| 2020/0044045 | A1 * | 2/2020 | Wang ................ | H01L 29/66439 |
| 2020/0052091 | A1 * | 2/2020 | Cheng ................ | H10D 30/6735 |
| 2020/0066872 | A1 * | 2/2020 | Lin ...................... | H10D 62/822 |
| 2020/0098879 | A1 * | 3/2020 | Lee .................... | H10D 84/0167 |
| 2020/0105608 | A1 * | 4/2020 | Yu ..................... | H01L 29/78696 |
| 2020/0152493 | A1 * | 5/2020 | Colombeau ....... | H01L 21/67196 |
| 2020/0312981 | A1 * | 10/2020 | Bomberger ............. | H01L 29/32 |
| 2020/0395482 | A1 * | 12/2020 | Song .................... | H10D 62/121 |
| 2021/0151319 | A1 * | 5/2021 | Kim ..................... | H10D 30/797 |
| 2021/0257499 | A1 * | 8/2021 | Shin .................. | H01L 29/42376 |
| 2022/0085161 | A1 * | 3/2022 | Noh ....................... | H10D 84/85 |
| 2022/0359678 | A1 * | 11/2022 | Kim ..................... | H10D 84/038 |

FOREIGN PATENT DOCUMENTS

| | | | | |
|---|---|---|---|---|
| TW | 202025312 A | | 7/2020 | |
| WO | WO-2016209285 A1 | * | 12/2016 | ............. B82Y 10/00 |

* cited by examiner

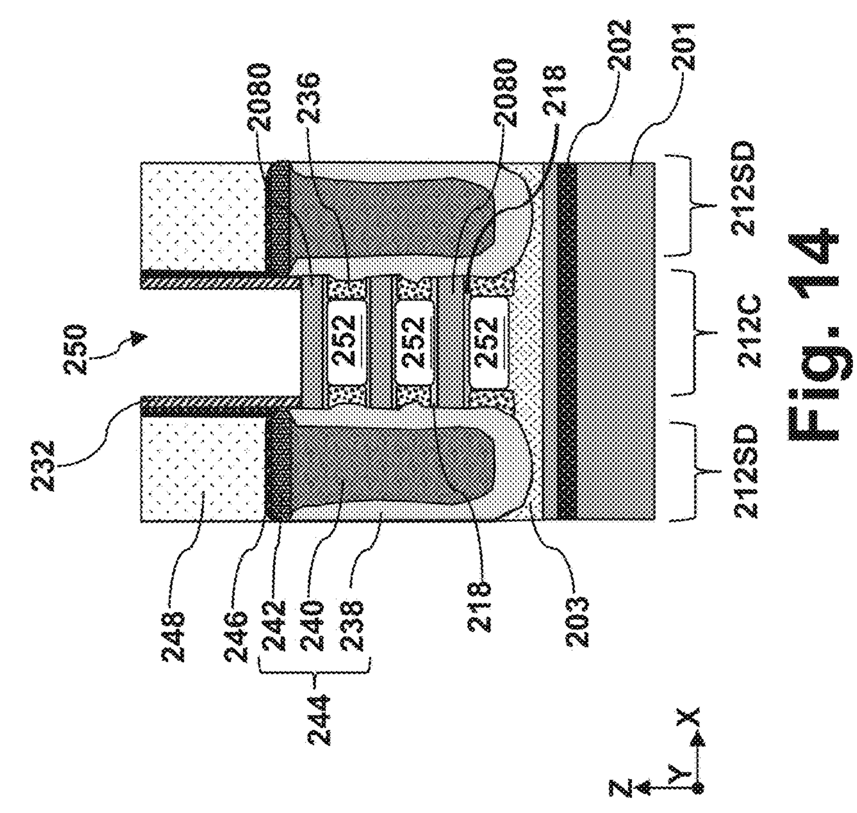
2080
236
2080
218
202
201
250
252
252
252
232
248
246
242
240
238
218
203
244
212SD
212C
212SD
Fig. 14
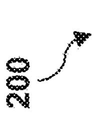
200

MULTIGATE TRANSISTORS WITH CAPPING LAYERS AND A BUFFER LAYER COMPRISING GERMANIUM

PRIORITY DATA

This application claims priority to U.S. Provisional Patent Application No. 63/234,429, filed on Aug. 18, 2021, entitled "Multi-gate Transistors Having Cap Layers", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Formation of an MBC transistor includes forming on a substrate a stack that includes channel layers interleaved by sacrificial layers. Before formation of a gate structure over a channel region, the sacrificial layers are selectively removed to release the channel layers as channel members. A gate structure is then formed to wrap around each of the channel members. The release of the channel members may present challenges. While existing MBC transistors and fabrication processes thereof are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-15 illustrate fragmentary cross-sectional views of a workpiece during a fabrication process according to the method of FIG. 1, according to one or more aspects of the present disclosure.

DETAILED DESCRIPTION

Figure 1:
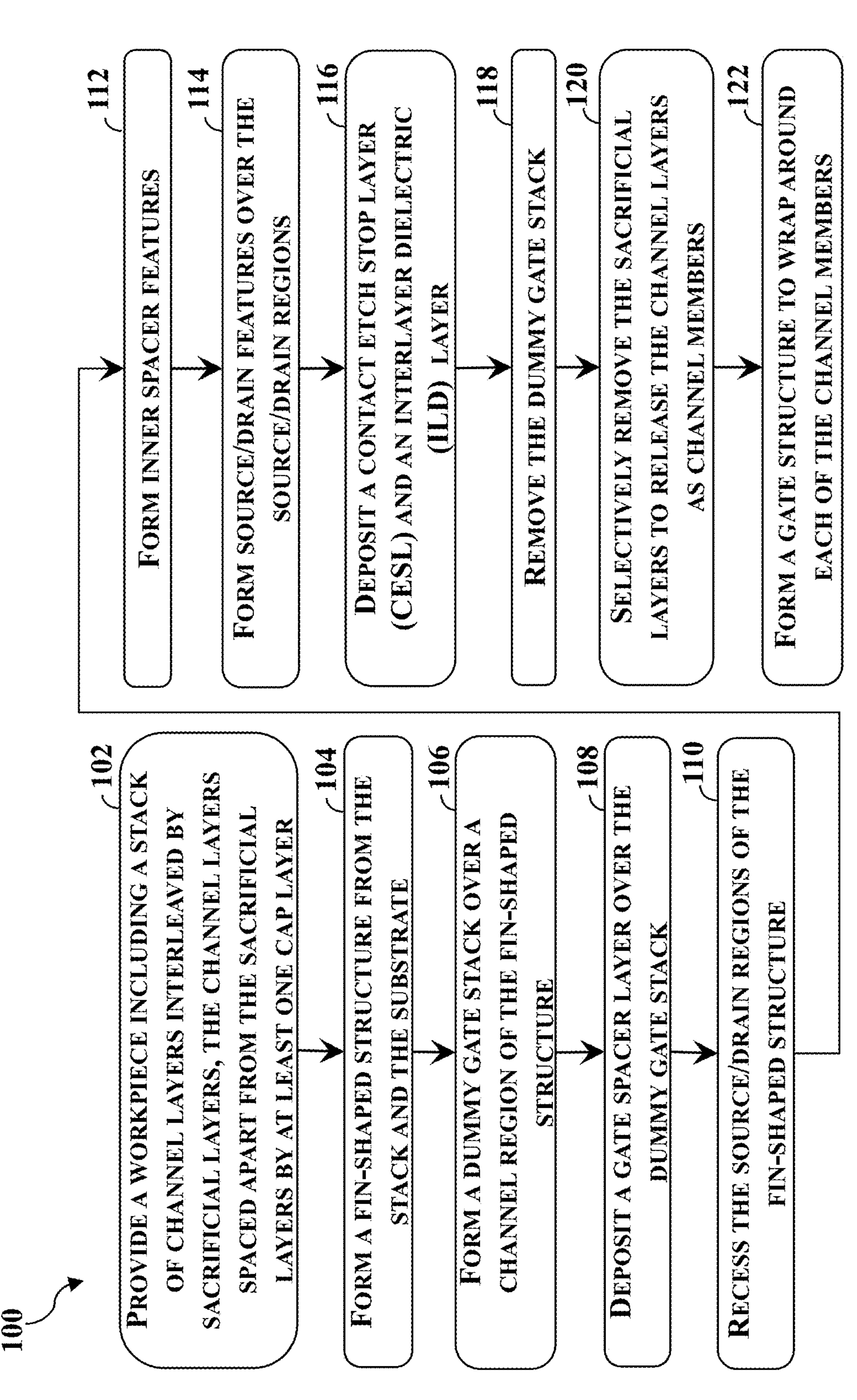
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to MBC transistor fabrication methods where the channel layers are protected by at least one cap layer. In some instances, a channel region of an MBC transistor may include a vertical stack of germanium-tin (GeSn) nanostructures or a vertical stack of silicon germanium (SiGe) nanostructures that extend between two source/drain features. These nanostructures may be referred to as channel members and may come in different shapes. Depending on their shapes, they may also be referred to as nanowires or nanosheets. To form the vertical stack of channel members, a stack that includes channel layers interleaved by sacrificial layers may be formed. In some implementations, the sacrificial layers may be germanium layers. To improve the etch selectivity of the sacrificial layers, the sacrificial layers may be doped with a dopant, such as boron (B), phosphorus (P), or arsenic (As). The dopant, however, may diffuse into the channel layers, thus making them susceptible to etching. Additionally, satisfactory removal of the sacrificial layers may also remove a portion of the channel layers. The unintentional dopant diffusion into or etching of the channel members may lead to buckling or other defects in the channel members. Buckling of the channel members may reduce drive current of the MBC transistor.

The present disclosure provides methods to form an MBC transistor. Methods according to the present disclosure include forming a vertical stack of channel layers that are interleaved by sacrificial layers. In some embodiments, the channel layers may include germanium-tin (GeSn) or silicon germanium (SiGe) and the sacrificial layers may include germanium (Ge) doped with an n-type dopant or a p-type dopant. According to the present disclosure, at least one cap layer is disposed between a channel layer and an adjacent sacrificial layer. In one embodiment, the at least one cap layer includes a first cap layer in contact with the sacrificial layers and a second cap layer in contact with the channel layers. The first cap layer functions to control diffusion of dopants in the sacrificial layers into the channel layers. The second cap layer functions to control the etch end point when the sacrificial layers are removed. When the at least one cap layer includes a germanium-tin (GeSn) layer, a portion of the at least one cap layer may remain present in the final structure of the MBC transistor.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-15, which are fragmentary cross-sectional views of workpiece 200 at different stages of fabrication according to embodiments of the method 100 in FIG. 1. Because the workpiece 200 will be fabricated into a semiconductor device, the workpiece 200 may be referred to herein as a semiconductor device 200 or a semiconductor structure 200 as the context requires. Throughout the present disclosure, like reference numerals denote like features, unless otherwise excepted.

Figure 2:
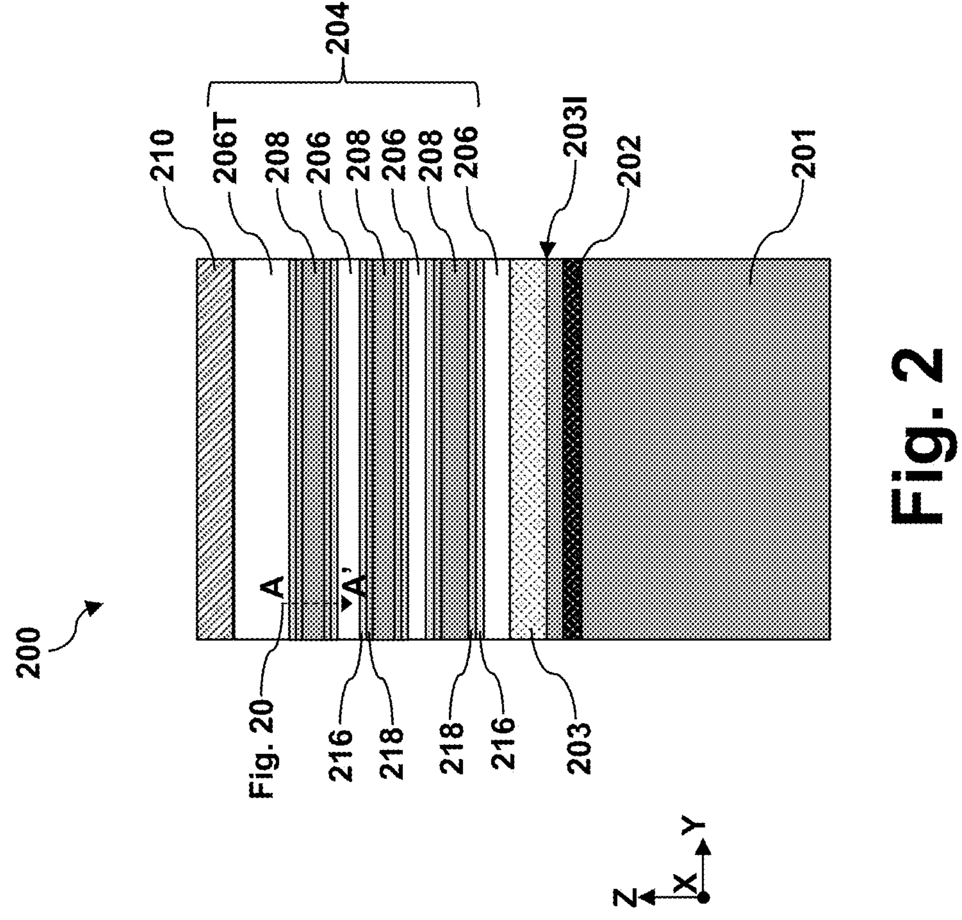

Referring to FIGS. 1 and 2, method 100 includes a block 102 where a workpiece 200 is provided. The workpiece 200 includes a stack 204 of alternating semiconductor layers disposed over a substrate 201. The substrate 201 may be a bulk semiconductor substrate. In one embodiment, the substrate 201 is a bulk silicon (Si) substrate. In some alternative embodiments, the substrate 201 may include germanium (Ge), a compound semiconductor such as silicon carbide (SiC), gallium arsenic (GaAs), indium arsenide (InAs), indium phosphide (InP), or an alloy semiconductor such as germanium-tin (GeSn), silicon germanium (SiGe), silicon germanium carbide (SiGeC), gallium arsenic phosphide (GaAsP), or gallium indium phosphide (GaInP). Alternatively, the substrate 201 may include a buried oxide layer to have a semiconductor-on-insulator construction. For example, the substrate 201 may include a silicon-on-insulator (SOI) structure, a germanium-on-insulator (GeOI) structure, or a germanium-tin-on-insulator (GeSnOI) structure. In the embodiment depicted in FIG. 2, the substrate 201 has an SOI structure and includes a buried oxide layer 202 in a bulk silicon (Si) substrate. While not explicitly shown in FIG. 2, the substrate 201 may be a bulk silicon (Si) substrate without the buried oxide layer 202.

In some embodiments represented in FIG. 2, the workpiece 200 includes a buffer layer 203 disposed directly on the substrate 201. The buffer layer 203 serves as a transition region between the substrate 201 and a bottommost layer of the stack 204 to reduce lattice mismatch. Because the layers in the stack 204 are formed using epitaxial deposition, lattice defects in lower epitaxial layers may permeate to upper epitaxial layers. For example, when a top surface of the substrate 201 consists essentially of silicon and the bottommost layer in the stack 204 consists essentially of germanium, the germanium lattice in the bottommost layer in the stack 204 may be subject to substantial strain due to lattice mismatch between silicon and germanium. Such strain may lead to lattice defects and these lattice defects may be translated into epitaxial layers overlying the bottommost layer in the stack 204. When the buffer layer 203 of a sufficient thickness is epitaxially deposited on the substrate 201 as shown in FIG. 2, lattice defects may only be present at or near an interface 203I with the substrate 201 but do not propagate through the thickness of the buffer layer 203. This is so because the lattice strain may be gradually released with the distance from the interface 203I. In an ideal case, a top surface of the buffer layer 203 may include germanium lattice structures that are substantially defect-free. The top surface of the buffer layer 203 therefore serves as a low-lattice-strain foundation for the formation of the stack 204. In some embodiments, the buffer layer 203 includes germanium (Ge) that is undoped or not intentionally doped. To sufficiently release the lattice strain at the interface 203I, the buffer layer 203 may have a thickness between about 50 nm and about 200 nm. This thickness is not trivial. When the thickness of the buffer layer 203 is smaller than 50 nm, the lattice defect density on the top surface of the buffer layer 203 may still be too high, preventing formation of high-quality stack 204. When the thickness of the buffer layer 203 is greater than 200 nm, the buffer layer 203 may unduly increase the thickness of the workpiece 200, which may increase process time and production cost.

In some embodiments, the stack 204 includes channel layers 208 of a first semiconductor composition interleaved by sacrificial layers 206 of a second semiconductor composition. The first semiconductor composition is different from the second semiconductor composition such that the sacrificial layers 206 may be selectively recessed or removed in subsequent process steps. In some embodiments, the sacrificial layers 206 include germanium (Ge) and the channel layers 208 include silicon germanium (SiGe) or germanium-tin (GeSn). When the channel layers 208 include germanium-tin (GeSn), each of the channel layers 208 may include about 7% and about 13% of tin and about 87% and about 93% of germanium. To increase the etch selectivity of the sacrificial layers 206 relative to channel layers 208, the sacrificial layers 206 may be doped with a p-type dopant, such as boron (B), or an n-type dopant, such as phosphorus (P) or arsenic (As). In the depicted embodiments, the sacrificial layers 206 are doped with boron (B) and the sacrificial layers 206 may be said to be formed of boron-doped germanium (Ge:B). In some implementations, the sacrificial layers 206 may include a boron concentration between about $5\times10^{18}$ atoms/cm$^3$ and about $2\times10^{21}$ atoms/cm$^3$. With the presence of the dopant, a germanium content in the sacrificial layers 206 may be between about 90% and about 100%. It is noted that fourth (4) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, the sacrificial layers 206 may have a substantially uniform first thickness between about 5 nm and about 30 nm, such as between about 5 nm and about 20 nm, and the channel layers 208 may have a substantially uniform second thickness between about 5 nm and about 30 nm. The first thickness and the second thickness may be identical or different. As described in more detail below, the channel layers 208 or parts thereof may serve as channel member(s) for a sub sequently-formed multi-gate device and the thickness of each of the channel layers 208 is chosen based on device performance considerations and thickness loss during selective removal of the sacrificial layers 206. In some embodiments represented in FIG. 2, the sacrificial layers 206 include a top sacrificial layer 206T that is thicker than the lower sacrificial layers 206. The thicker top sacrificial layer 206T is implemented to withstand a subsequent planarization process. The top sacrificial layer 206T may have a third thickness that is about 1.3 and about 2.5 times of the second thickness of the rest of the sacrificial layers 206. In some instances, the third thickness of the top sacrificial layer 206T may be between about 8 nm and about 40 nm.

Figure 16:
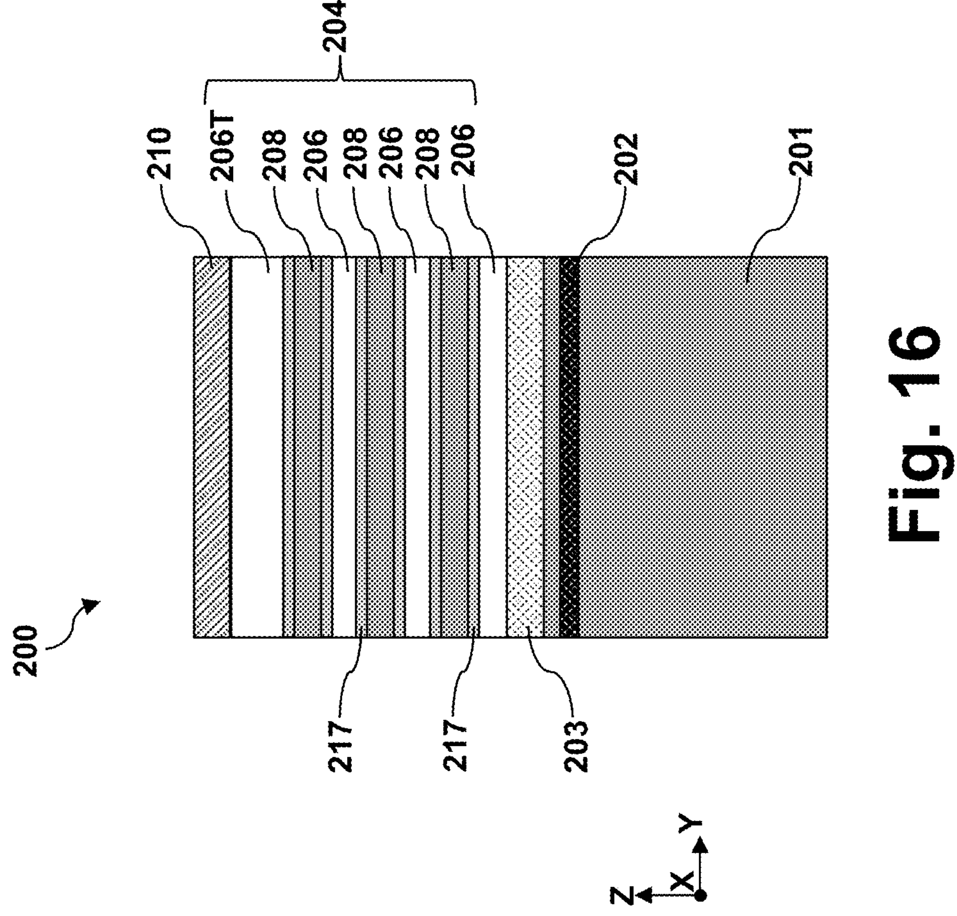
FIG. 16 illustrates a fragmentary cross-sectional view of an alternative semiconductor stack over a workpiece, according to one or more aspects of the present disclosure.
Figure 18:
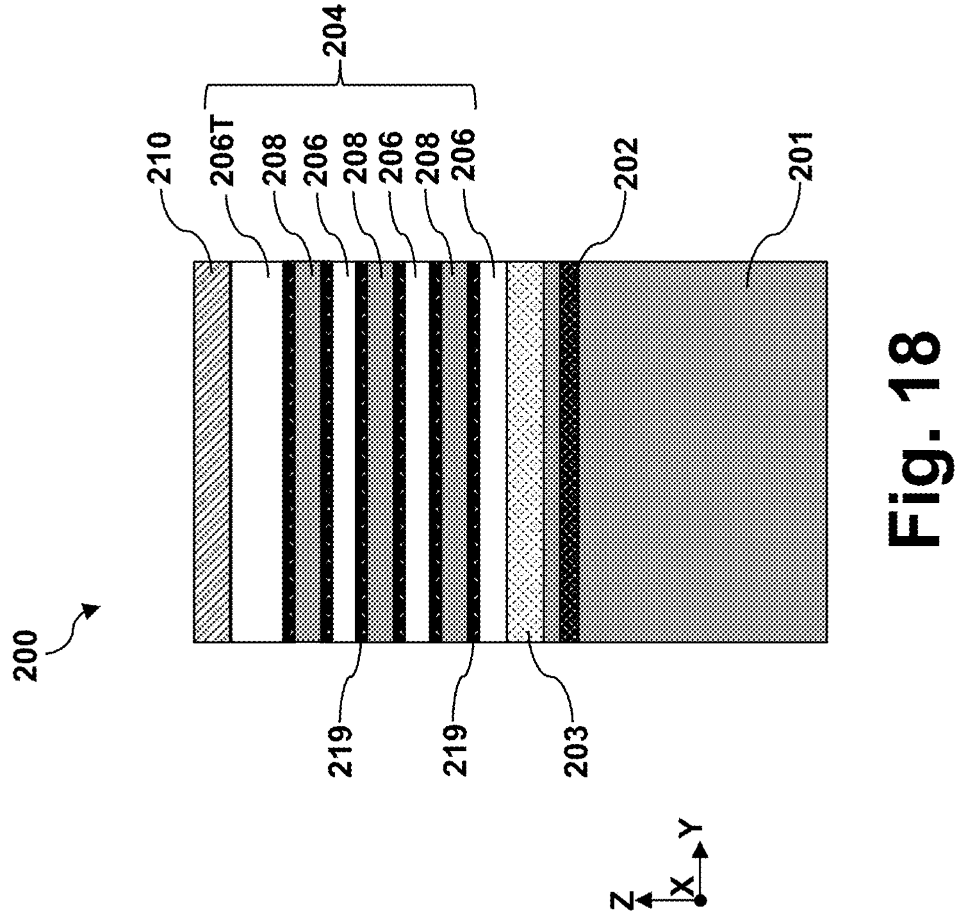
FIG. 18 illustrates a fragmentary cross-sectional view of an alternative semiconductor stack over a workpiece, according to one or more aspects of the present disclosure.

Allowing the sacrificial layers 206 to come in direct contact with the channel layers 208 may present challenges. For example, dopants in the sacrificial layers 206 may diffuse into the channel layers 208, resulting in increase in threshold voltages or reduction of etch selectivity of the sacrificial layers 206. Dopant diffusion may alter the threshold voltages of the resulting MBC transistors because the type of the dopant may be different from the conductivity type of the MBC transistor. Dopants in the sacrificial layers 206, such boron (B), may render the channel layers 208 less etch resistant when the sacrificial layers 206 are removed. To meet these challenges, the stack 204 of the present disclosure may include at least one cap layer between a channel layer 208 and an adjacent sacrificial layer 206. The at least one cap layer of the present disclosure may control or prevent dopant diffusion from the sacrificial layers 206 to the channel layers 208 and may provide more control of the selective removal of the sacrificial layers 206. The at least one cap layer may be a dual layer or a single layer. When the at least one cap layer is a dual layer, it includes a first cap layer 216 and a second cap layer 218 as shown in FIG. 2. In some embodiments, the first cap layer 216 includes undoped germanium (Ge) and the second cap layer 218 includes germanium-tin (GeSn). When the at least one cap layer is a single layer, it may be a first single cap layer 217 as shown in FIG. 16 or a second single cap layer 219 as shown in FIG. 18.

As shown in FIG. 2, each of the first cap layers 216 comes in direct contact with one of the sacrificial layers 206 and each of the second cap layers 218 comes in direct contact with one of the channel layers 208. Each of first cap layers 216 is also in direct contact with one of the second cap layers 218. In other words, each of the first cap layers 216 is sandwiched between a sacrificial layer 206 and a second cap layer 218 and each of the second cap layers 218 is sandwiched between a first cap layer 216 and a channel layer 208. The stack 204 includes the same number of the first cap layer 216 and the second cap layers 218. In the embodiments represented in FIG. 2, the stack 204 includes 6 first cap layers 216 that interface the sacrificial layers 206 and 6 second cap layers 218 that interface the channel layers 208.

In some embodiments, each of the first cap layers 216 is formed of undoped germanium (Ge) and has a thickness between about 1 nm and about 5 nm. This thickness range is not trivial. When the thickness of the first cap layer 216 is less than 1 nm, the first cap layer 216 may not adequately prevent dopant diffusion from the sacrificial layers 206 into the channel layers 208. When the thickness of the first cap layer 216 is greater than 5 nm, it may leave smaller room for other layers in the stack 204. The deposition of the layers in the stack 204 may implement process temperatures between about 250° C. and about 400° C. and the thermal energy may cause dopant diffusion from the sacrificial layers 206 into the first cap layers 216. As a result, in some embodiments, although the first cap layers 216 are not in-situ doped when they are epitaxially deposited, each of them may include a dopant concentration gradient away from an interface with the adjacent sacrificial 206. That is, the dopant concentration in each of the first cap layer 216 is at its maximum at the interface with the adjacent sacrificial 206 and gradually decreases with a distance from the interface. As described above, the dopant in the sacrificial layers 206 may be boron (B), phosphorus (P), or arsenic (As) in various embodiments. In those embodiments, a boron concentration gradient, a phosphorus concentration gradient, or an arsenic concentration gradient may be present in each of the first cap layers 216.

In some embodiments, each of the second cap layers 218 is formed of germanium-tin (GeSn) and has a thickness between about 2 nm and about 10 nm. This thickness range is not trivial. When the thickness of the second cap layer 218 is less than 2 nm, the second cap layer 218 may not adequately protect the channel layers 208, leading to over-etch of the channel layers 208 when the sacrificial layers 206 are removed. When the thickness of the second cap layer 218 is greater than 10 nm, the second cap layers 218 may take up valuable room for the gate structure. The second cap layers 218 serve functions similar to an etch stop layer to control the etch end point when the sacrificial layers 206 are removed. In some embodiments, the germanium content and tin content in the second cap layers 218 are uniform through the thickness of the second cap layers 218 and the etch end point control is substantially time-based. That is, the etch rate changes after the sacrificial layers 206 and the first cap layers 216 are removed and the second cap layers 218 are exposed. In these embodiments, the germanium content in the second cap layers 218 may be between about 95% and about 99.5% and the tin content in the second cap layer 218 may be between about 0.5% and about 5%. To ensure that the second cap layers 218 are less etch-resistant than the channel layers 208, the tin content in the second cap layers 218 may be between about 5% and about 40% of the tin content in the channel layers 208.

Figure 3:
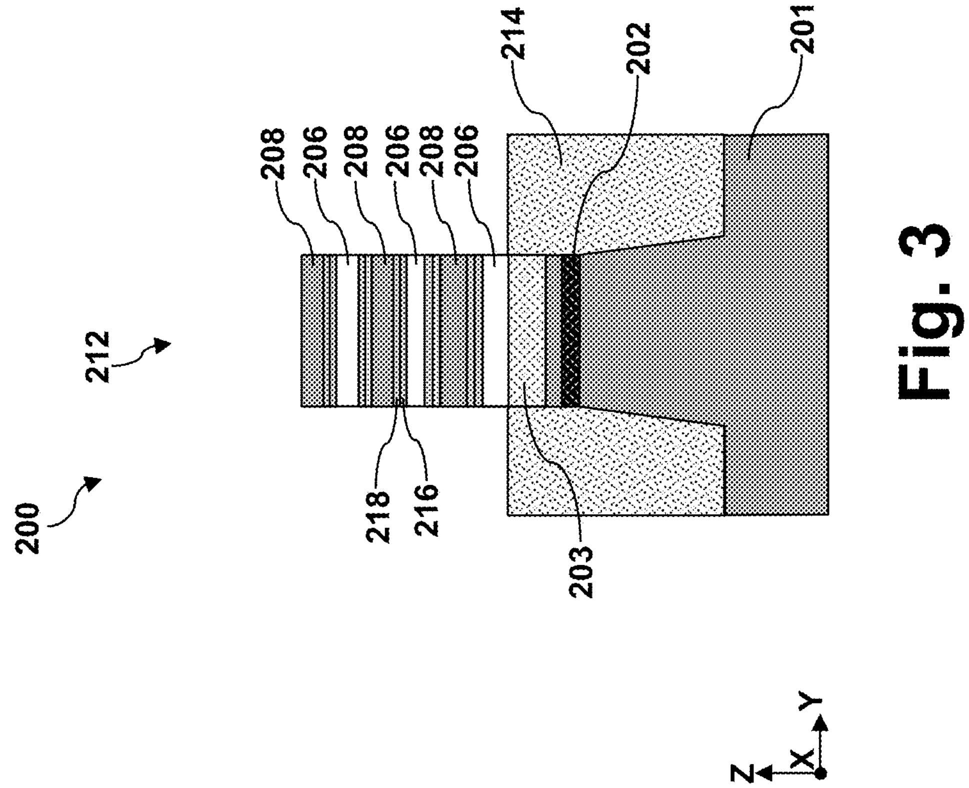
Figure 20:
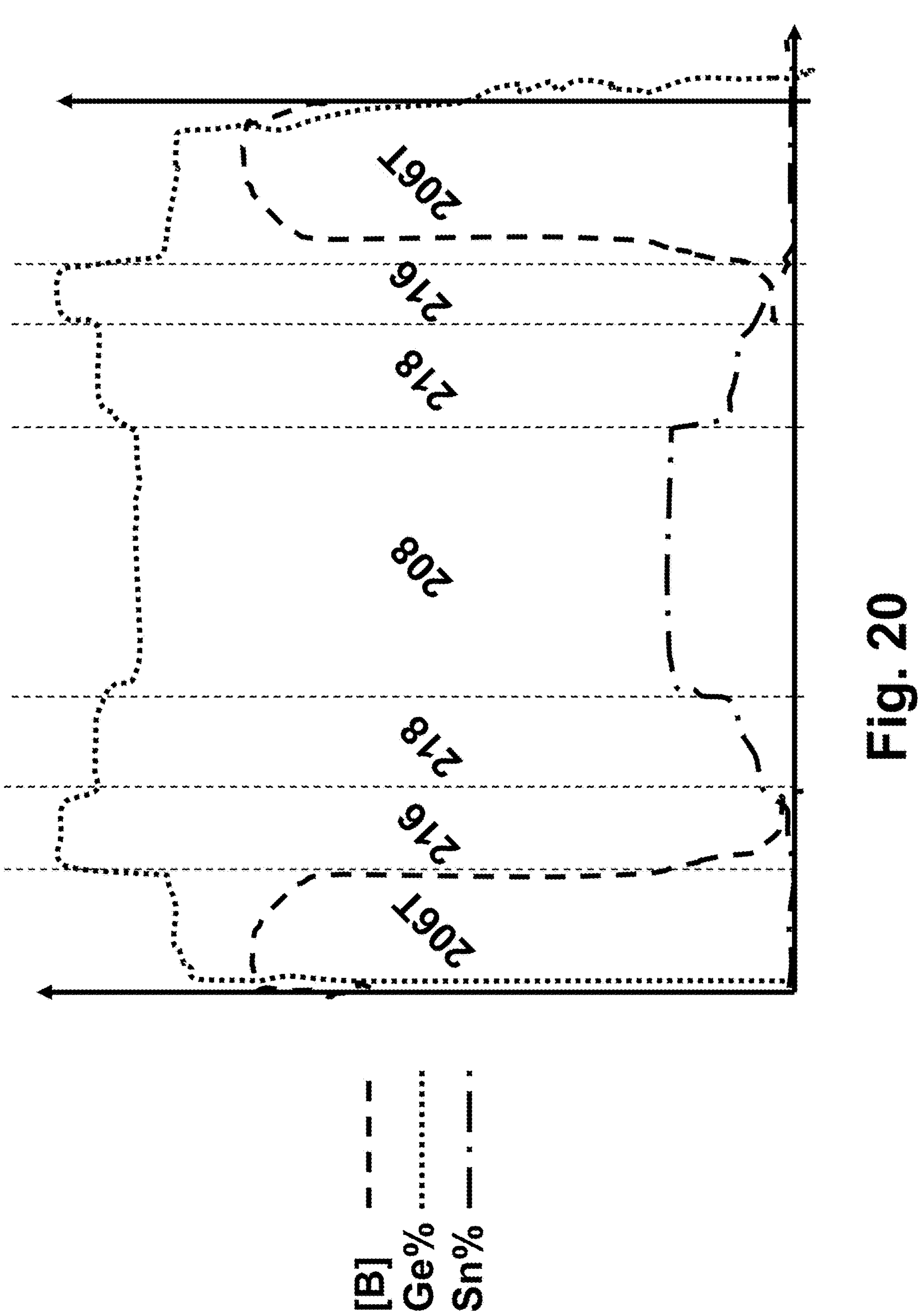
FIG. 20 illustrates a schematic Secondary Ion Mass Spectrometer (SIMS) concentration profile through a channel layer and sacrificial layers, first cap layers and second cap layers over and below the channel layer.

In some alternative embodiments, each of the second cap layers 218 include a tin content gradient. In these embodiments, the deposition of the second cap layers 218 is controlled such that the tin content in each of the second cap layers 218 is at its minimum at an interface with an adjacent first cap layer 216 and gradually increases toward an interface with an adjacent channel layer 208. Because the etch rate decreases with the tin content, the tin content gradient described above may cause the etch rate of the second cap layers 218 to gradually decreases toward to the channel layers 208. In one example, the tin content in each of the second cap layers 218 is about 0.5% near an interface with an adjacent first cap layer 216 and gradually increases to about 5% near an interface with an adjacent channel layer 208. Concentrations of boron, germanium and tin across channel layers 208, the first cap layers 216, second cap layers 218, and sacrificial layers 206 may be measured by Secondary Ion Mass Spectrometry (SIMS). An example SIMS concentration profile along line A-A' in FIG. 3 is provided in FIG. 20. As shown in FIG. 20, each of the sacrificial layers 206 includes boron-doped germanium (Ge:B). Due to diffusion, a lower concentration of boron dopant may be present in adjacent first cap layers 216. In the example illustrated in FIG. 20, the germanium contents in the channel layer 208, the second cap layer 218 and the first cap layer 216 may be greater than that in the sacrificial layers 206. Tin content reaches its maximum in the channel layers 206 and exhibits a step reduction at the interfaces with the second cap layers 218. The tin content in the second cap layers 218 may gradually decrease away from the interface with the channel layer 208 and may drop to substantially zero in the first cap layers 216.

The layers in the stack 204 may be deposited using a reduced pressure CVD (RPCVD) process, a molecular beam epitaxy (MBE) process, a vapor phase deposition (VPE) process, and/or other suitable epitaxial growth processes. Formation of different layers in the stack 204 may include use of different combination of precursors and process temperatures. For example, formation of the buffer layer 203 may include use of germane ($GeH_4$) and a process temperature between about 250° C. and about 400° C. Formation of the sacrificial layers 206 may include use of germane ($GeH_4$) and boron trichloride ($BCl_3$) and a process temperature between about 250° C. and about 400° C. Formation of the first cap layers 216 may include use of germane ($GeH_4$) and a process temperature between about 250° C. and about 400° C. Formation of the second cap layers 218 may include use of germane ($GeH_4$) and tin tetrachloride ($SnCl_4$) and a process temperature between about 250° C. and about 400° C. Formation of the channel layers 208 may include use of germane ($GeH_4$) and tin tetrachloride ($SnCl_4$) and a process temperature between about 250° C. and about 400° C.

Referring still to FIGS. 1, 2 and 3, method 100 includes a block 104 where a fin-shaped structure 212 is formed from the stack 204 and the substrate 201. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer over the pad oxide layer. The fin-shaped structure 212 may be patterned from the stack 204, the buffer layer 203, and the substrate 201 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending through the stack 204, the buffer layer 203 and a portion of the substrate 201. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204, the buffer layer 203, and the substrate 201. As shown in FIG. 3, the fin-shaped structure 212, along with the sacrificial layers 206 and the channel layers 208 therein, extends vertically along the Z direction and lengthwise along the X direction. In embodiments represented in FIG. 3, the top sacrificial layer 206T, the topmost first cap layer 216 and the topmost second cap layer 218 may be completely consumed during the formation of the fin-shaped structure 212.

An isolation feature 214 is formed adjacent the fin-shaped structure 212. In some embodiments, the isolation feature 214 may be formed in the trenches to isolate the fin-shaped structures 212 from a neighboring active region. The isolation feature 214 may also be referred to as a shallow trench isolation (STI) feature 214. By way of example, in some embodiments, a dielectric layer is first deposited over the substrate 201, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214. The fin-shaped structure 212 rises above the STI feature 214 after the recessing, as shown in FIG. 3. In some embodiments not explicitly shown in the figures, a silicon liner may be formed over the fin-shaped structure 212 before the formation of the STI feature 214. The silicon liner functions to ensure quality of a dummy dielectric layer (described below) that is later formed over the fin-shaped structure 212.

Figure 4:
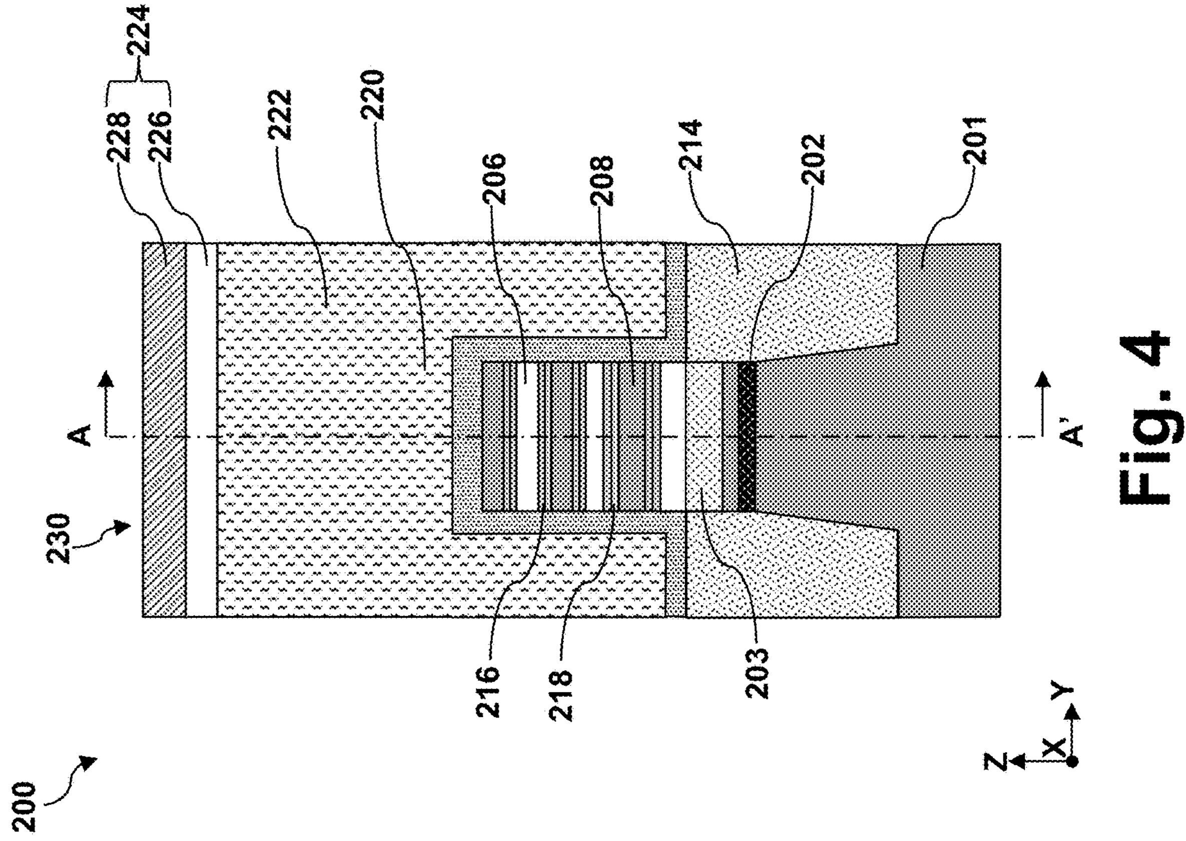
Figure 5:
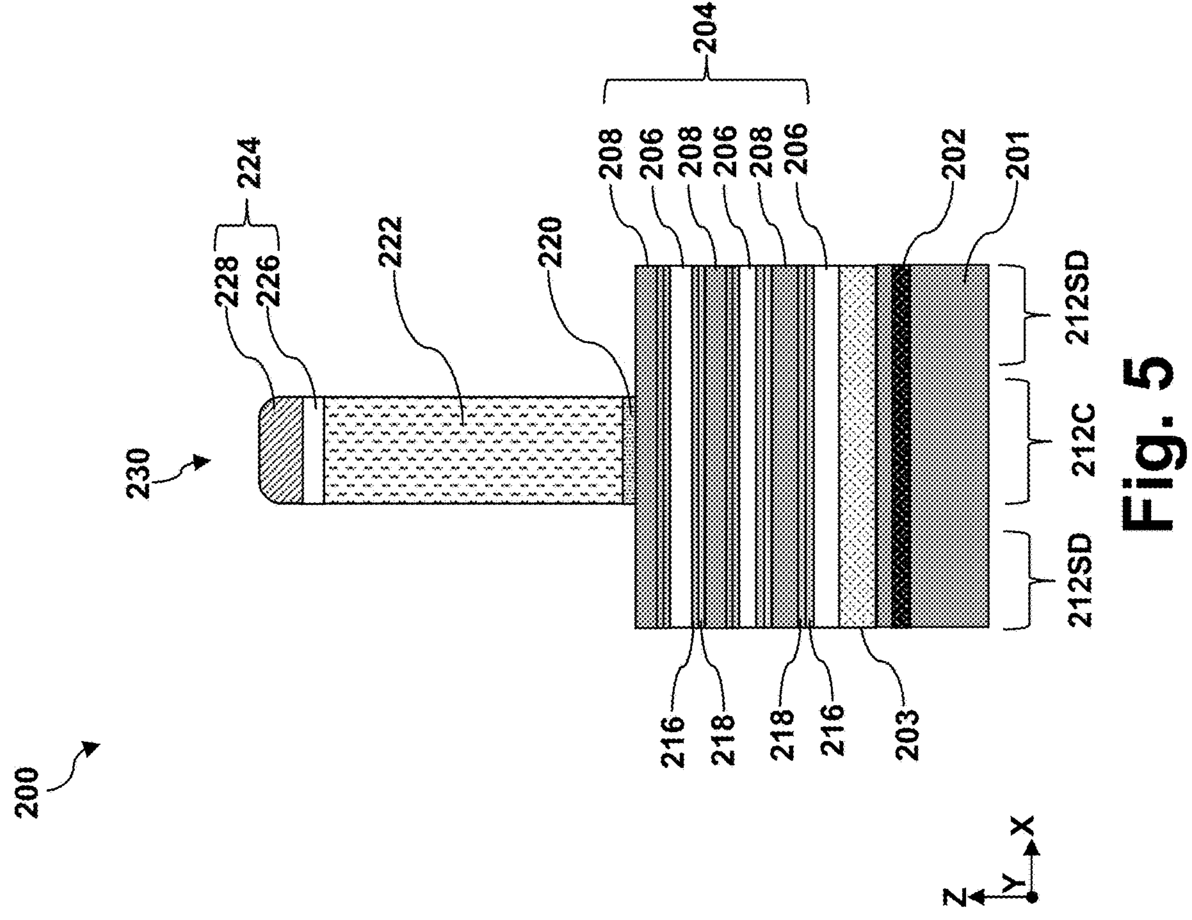

Referring to FIGS. 1, 4 and 5, method 100 includes a block 106 where a dummy gate stack 230 is formed over a channel region 212C of the fin-shaped structure 212. In some embodiments, a gate replacement process (or gate-last process) is adopted where the dummy gate stack 230 (shown in FIGS. 4 and 5) serves as a placeholder to undergo various processes and is to be removed and replaced by the functional gate structure. Other processes and configuration are possible. In some embodiments illustrated in FIG. 5, the dummy gate stack 230 is formed over the fin-shaped structure 212 and the fin-shaped structure 212 may be divided into channel regions 212C underlying the dummy gate stacks 230 and source/drain regions 212SD that do not underlie the dummy gate stacks 230. The channel regions 212C are adjacent the source/drain regions 212SD. As shown in FIG. 5, the channel region 212C is disposed between two source/drain regions 212SD along the X direction.

The formation of the dummy gate stack 230 may include deposition of layers in the dummy gate stack 230 and patterning of these layers. Referring to FIG. 4, a dummy dielectric layer 220, a dummy electrode layer 222, and a gate-top hard mask layer 224 may be blanketly deposited over the workpiece 200. In some embodiments, the dummy dielectric layer 220 may be formed on the fin-shaped structure 212 using a chemical vapor deposition (CVD) process, an ALD process, an oxygen plasma oxidation process, or other suitable processes. In some instances, the dummy dielectric layer 220 may include silicon oxide. Thereafter, the dummy electrode layer 222 may be deposited over the dummy dielectric layer 220 using a CVD process, an ALD process, or other suitable processes. In some instances, the dummy electrode layer 222 may include polysilicon. For patterning purposes, the gate-top hard mask layer 224 may be deposited on the dummy electrode layer 222 using a CVD process, an ALD process, or other suitable processes. The gate-top hard mask layer 224, the dummy electrode layer 222 and the dummy dielectric layer 220 may then be patterned to form the dummy gate stack 230, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 224 may include a silicon oxide layer 226 and a silicon nitride layer 228 over the silicon oxide layer 226. As shown in FIG. 5, no dummy gate stack 230 is disposed over the source/drain region 212SD of the fin-shaped structure 212.

Figure 6:
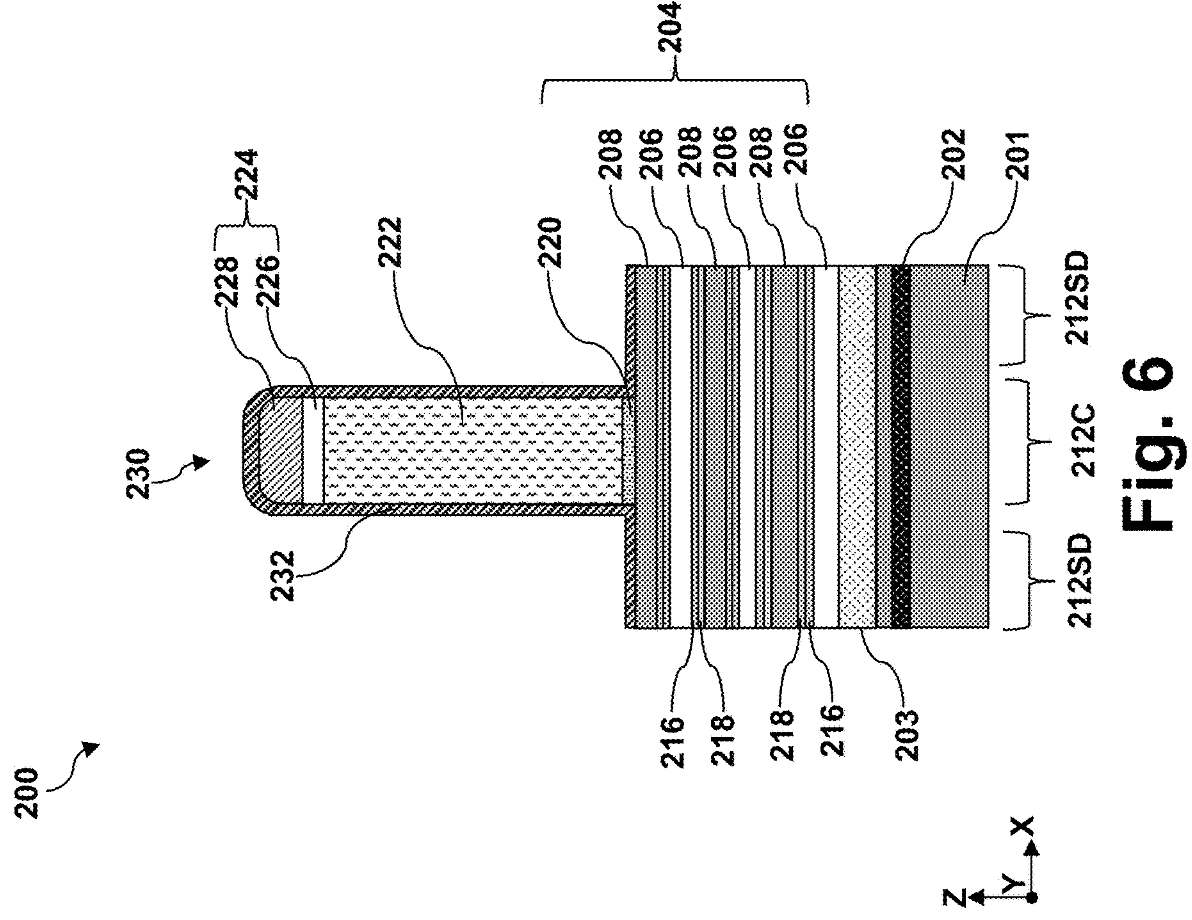

Referring to FIGS. 1 and 6, method 100 includes a block 108 where a gate spacer layer 232 is deposited over the dummy gate stack 230. In some embodiments, the gate spacer layer 232 is deposited conformally over the workpiece 200, including over top surfaces and sidewalls of the dummy gate stack 230. The term "conformally" may be used herein for ease of description of a layer having substantially uniform thickness over various regions. The gate spacer layer 232 may be a single layer or a multi-layer. The at least one layer in the gate spacer layer 232 may include silicon carbonitride, silicon oxycarbide, silicon oxycarbonitride, or silicon nitride. The gate spacer layer 232 may be deposited over the dummy gate stack 230 using processes such as, a CVD process, a subatmospheric CVD (SACVD) process, an ALD process, or other suitable process.

Figure 7:
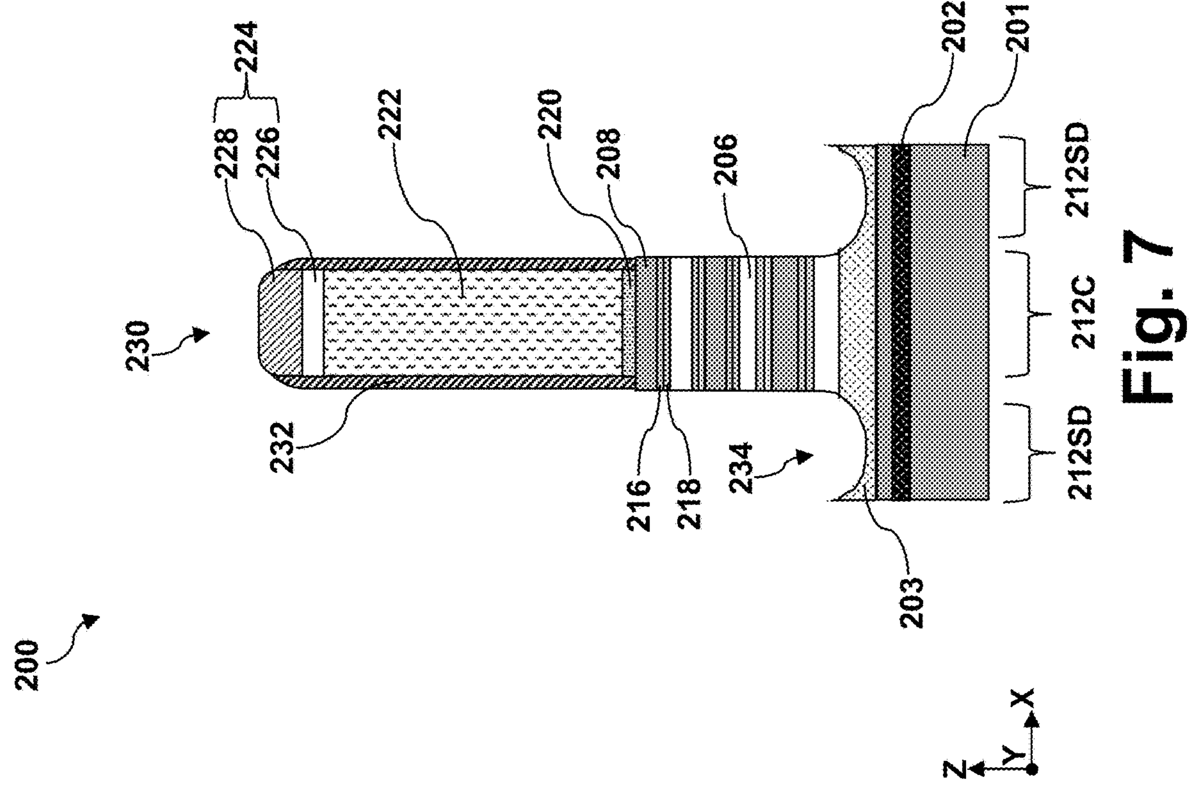

Referring to FIGS. 1 and 7, method 100 includes a block 110 where a source/drain region 212SD of the fin-shaped structure 212 is recessed to form a source/drain trench 234. In some embodiments, the source/drain regions 212SD that are not covered by the dummy gate stack 230 and the gate spacer layer 232 are etched by a dry etch or a suitable etching process to form the source/drain trenches 234. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or CHBR3), an iodine-containing gas, other suitable gases and/or plasmas, and/or combinations thereof. In some embodiments represented in FIG. 7, the source/drain regions 212SD of the fin-shaped structure 212 are recessed to expose sidewalls of the sacrificial layers 206, the first cap layers 216, the second cap layers 218, and the channel layers 208. In some implementations, the source/drain trenches 234 may extend downward through the stack 204 and partially into the buffer layer 203. FIG. 7 illustrates a cross-sectional view of the workpiece 200 viewed along the Y direction at the source/drain region 212SD. As shown in FIG. 7, the sacrificial layers 206, the first cap layers 216, the second cap layers 218, and channel layers 208 in the source/drain region 212SD are removed at block 110, exposing the buffer layer 203.

Figure 8:
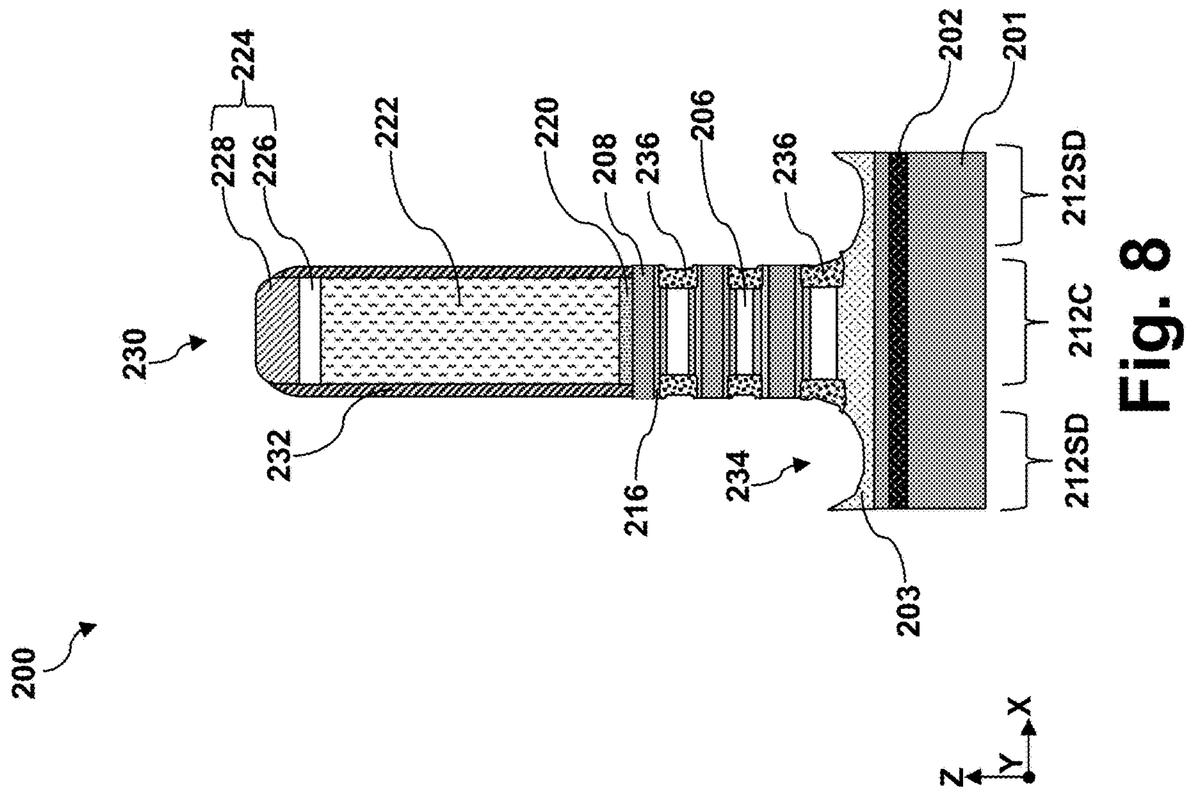

Referring to FIGS. 1 and 8, method 100 includes a block 112 where inner spacer features 236 are formed. While not shown explicitly, operation at block 112 may include selective and partial removal of the sacrificial layers 206 and the first cap layers 216 to form inner spacer recesses (shown as being occupied by the inner spacer features 236), deposition of inner spacer material (i.e., material for the inner spacer features 236) over the workpiece 200, and etch back the inner spacer material to form inner spacer features 236 in the inner spacer recesses. The sacrificial layers 206 and the first cap layers 216 exposed in the source/drain trenches 234 are selectively and partially recessed to form inner spacer recesses while the gate spacer layer 232, the channel layers 208, and the second cap layers 218 are substantially unetched. In some instances, the exposed buffer layer 203 may also be partially etched when the inner spacer recesses are formed. In an embodiment where the channel layers 208 include germanium-tin (GeSn) or silicon germanium (SiGe) and sacrificial layers 206 includes doped germanium, such as boron-doped germanium (Ge:B), the selective recess of the sacrificial layers 206 may be performed using a selective wet etch process or a selective dry etch process. In some embodiments, the selective dry etching process may include use of one or more fluorine-based etchants, such as fluorine gas or hydrofluorocarbons. The selective wet etching process may include use of hydrogen peroxide or an APM etch (e.g., ammonia hydroxide-hydrogen peroxide-water mixture).

After the inner spacer recesses are formed, the inner spacer material is deposited over the workpiece 200, including over the inner spacer recesses. The inner spacer material may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material may be a single layer or a multilayer. In some implementations, the inner spacer material may be deposited using CVD, PECVD, SACVD, ALD or other suitable methods. The inner spacer material is deposited into the inner spacer recesses as well as over the sidewalls of the channel layers 208 and the second cap layers 218 exposed in the source/drain trenches 234. Referring to FIG. 8, the deposited inner spacer material is then etched back to remove the inner spacer material from the sidewalls of the channel layers 208 and the second cap layers 218 to form the inner spacer features 236 in the inner spacer recesses. At block 112, the inner spacer material may also be removed from the top surfaces and/or sidewalls of the gate-top hard mask layer 224 and the gate spacer layer 232. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 8, each of the inner spacer features 236 is in direct contact with the recessed sacrificial layers 206 and the first cap layers 216. Additionally, each of the inner spacer features 236 is disposed between and in direct contact with two adjacent second cap layers 218. Put differently, each of the inner spacer features 236 is disposed between two neighboring channel layers 208. As shown in FIG. 8, while the selective etch process and etch back process at block 112 are selective to the sacrificial layers 206, the first cap layers 216 may also be etched because its composition is similar to that of the sacrificial layers 206.

While not explicitly shown in the figures, the method 100 may include a cleaning process to prepare the workpiece 200 for epitaxial growth. The cleaning process may include a dry clean, a wet clean, or a combination thereof. In some examples, the wet clean may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and or hydrofluoric acid for oxide removal. The dry clean process may include helium (He) and hydrogen ($H_2$) treatment at a temperature between about 250° C. and about 550° C. and under a pressure between about 75 mTorr and about 155 mTorr. The hydrogen treatment may convert germanium (Ge) on the surface to germane ($GeH_4$), which may be pumped out for removal. In some implementations, the cleaning process is configured to selectively remove or trim a portion of the channel layers without substantially removing the inner spacer features 236. The cleaning process may remove surface oxide and debris in order to ensure a clean semiconductor surface, which facilitates growth of high quality epitaxial layers at block 114.

Referring to FIGS. 1, 9, 10 and 11, method 100 includes a block 114 where source/drain features 244 are formed in the source/drain trenches 234 over the source/drain regions 212SD. In some implementations represented in FIGS. 9, 10 and 11, each of the source/drain features 244 may include a first epitaxial layer 238, a second epitaxial layer 240 over the first epitaxial layer 238, and a third epitaxial layer 242 over the second epitaxial layer 240. To form the source/drain features 244 depicted in FIG. 11, the first epitaxial layer 238, the second epitaxial layer 240, and the third epitaxial layer 242 are sequentially, epitaxially and selectively formed from the exposed sidewalls of the channel layers 208, exposed sidewalls of the second cap layers 218, and exposed surfaces of the buffer layer 203 while sidewalls of the sacrificial layers 206 and the first cap layers 216 remain covered by the inner spacer features 236. Suitable epitaxial processes for block 114 include reduced pressure CVD (RPCVD), vapor-phase epitaxy (VPE), ultra-high vacuum CVD (UHV-CVD), molecular beam epitaxy (MBE), and/or other suitable processes. The epitaxial growth process at block 114 may use gaseous precursors, which interact with the compositions of the buffer layer 203, the channel layers 208, and the second cap layers.

Figure 9:
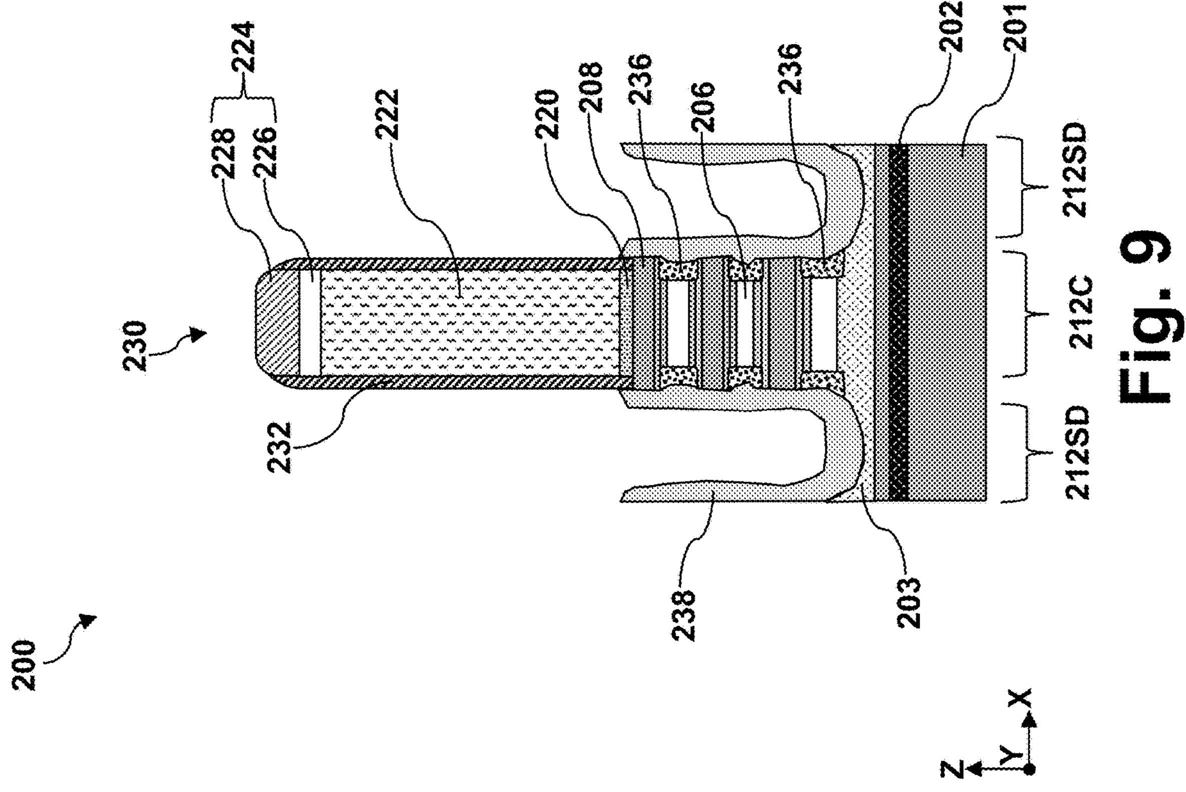

Referring to FIG. 9, the first epitaxial layer 238 is deposited in the source/drain trenches 234 over the source/drain regions 212SD. The composition of the first epitaxial layer 238 is selected such that the first epitaxial layer 238 are coupled to the sidewalls of the channel layers 208 without substantial lattice mismatch. The first epitaxial layer 238 may include germanium-tin (GeSn). In some instances, the first epitaxial layer 238 has a germanium content between about 85% and about 95% and a tin content between about 5% and about 12%. The germanium and tin contents of the first epitaxial layer 238 is slightly different from those of the channel layers 208 to exert just enough strain without causing substantial lattice mismatch. The first epitaxial layer 238 includes a dopant. When an n-type MBC transistor is intended, the first epitaxial layer 238 is doped with an n-type dopant, such as phosphorus (P) or arsenic (As). When a p-type MBC transistor is intended, the first epitaxial layer 238 is doped with a p-type dopant, such as boron (B). In the depicted embodiment, the first epitaxial layer 238 is doped with boron (B). To avoid excessive lattice mismatch with the channel layers 208, the boron dopant concentration in the first epitaxial layer 238 may be between about $1\times10^{20}$ atoms/$cm^3$ and about $5\times10^{20}$ atoms/$cm^3$. This concentration range is not trivial. When the boron concentration in the first epitaxial layer 238 is lower than about $1\times10^{20}$ atoms/$cm^3$, the resistance in the first epitaxial layer 238 may prevent satisfactory drive current (i.e., On-state current). When the boron dopant concentration in the first epitaxial layer 238 is greater than about $5\times10^{20}$ atoms/$cm^3$, boron in the lattice interstices may also cause too much defect at the interface between the first epitaxial layer 238 and the channel layers 208, which may lead to increased resistance. In some embodiments, as measured from the buffer layer 203 or the sidewalls of the channel layers 208, the first epitaxial layer 238 may have a thickness between 10 nm and about 30 nm. Although the epitaxial deposition of the first epitaxial layer 238 is selective to semiconductor surfaces, with the aforementioned thickness range, the first epitaxial layer 238 may merge over the inner spacer features 236 or even come in contact with the inner spacer features 236.

Figure 10:
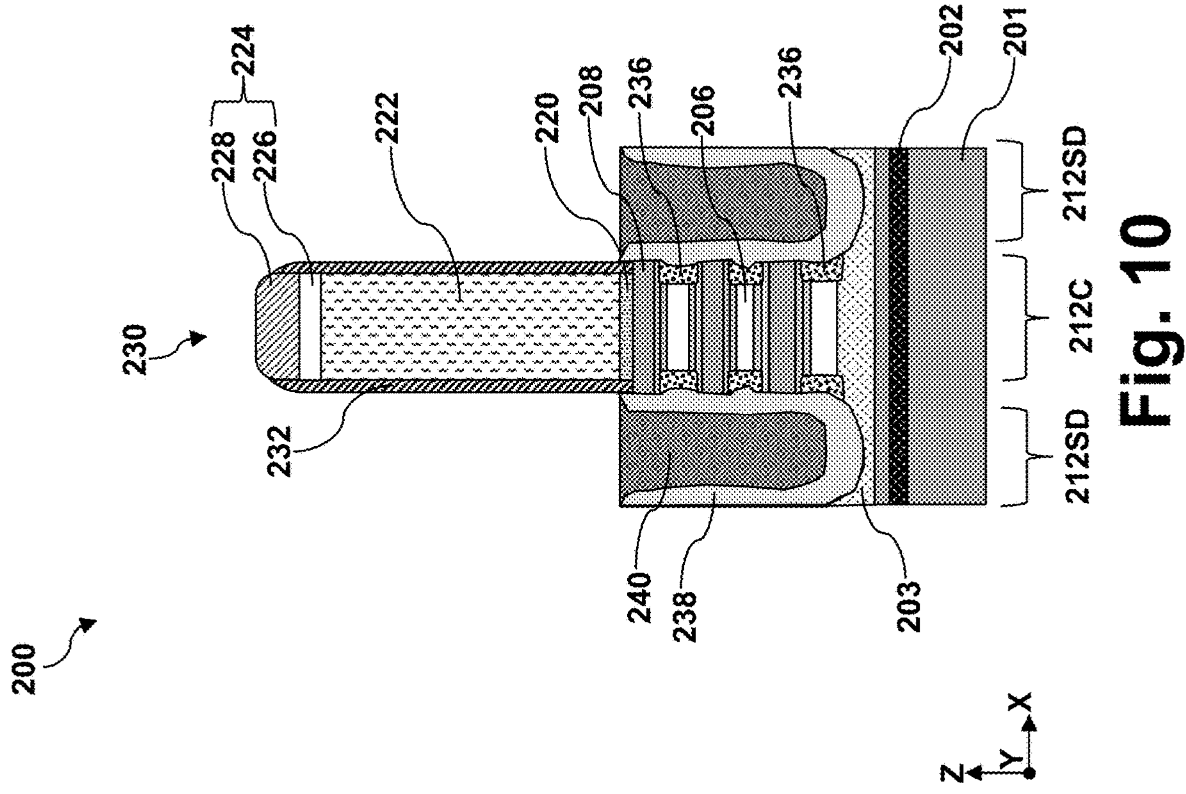

Referring to FIG. 10, the second epitaxial layer 240 is deposited over the first epitaxial layer 238. That is, the second epitaxial layer 240 is spaced apart from the channel layers 208, the first cap layers 216, the inner spacer features 236, and the buffer layer 203 by the first epitaxial layer 238. The composition of the second epitaxial layer 240 is selected to exert stress on the channel layers 208 and to minimize contact resistance. Like the first epitaxial layer 238, the second epitaxial layer 240 may also include germanium-tin (GeSn). In some instances, to exert sufficient stress on the channel layers, the second epitaxial layer 240 has a germanium content between about 90% and about 97% and a tin content between about 3% and about 10%. It can be seen that the germanium and tin contents of the second epitaxial layer 240 is more different from those of the channel layers 208 than those of the first epitaxial layer 238. The second epitaxial layer 240 and the first epitaxial layer 238 have the same type of dopant. When an n-type MBC transistor is intended, the second epitaxial layer 240 is doped with an n-type dopant, such as phosphorus (P) or arsenic (As). When a p-type MBC transistor is intended, the second epitaxial layer 240 is doped with a p-type dopant, such as boron (B). In the depicted embodiment, the second epitaxial layer 240 is doped with boron (B). To reduce contact resistance, the boron dopant concentration in the second epitaxial layer 240 may be between about $1\times10^{21}$ atoms/$cm^3$ and about $2\times10^{21}$ atoms/$cm^3$. This concentration range is not trivial. When the boron concentration in the second epitaxial layer 240 is lower than about $1\times10^{21}$ atoms/$cm^3$, the resistance in the second epitaxial layer 240 may prevent satisfactory drive current (i.e., On-state current). The boron dopant concentration in the second epitaxial layer 240 may not be greater than about $2\times10^{21}$ atoms/$cm^3$ due to the solubility limit of boron in germanium-tin lattice. In some embodiments, as measured from surfaces of the first epitaxial layer 238, the second epitaxial layer 240 may have a thickness between 30 nm and about 80 nm. The thickness or volume of the second epitaxial layer 240 is maximized to maximize the stress on the channel layers 208 and minimize contact resistance. That is the thickness of the second epitaxial layer 240 is greater than that of the first epitaxial layer 238 or the third epitaxial layer 242.

Figure 11:
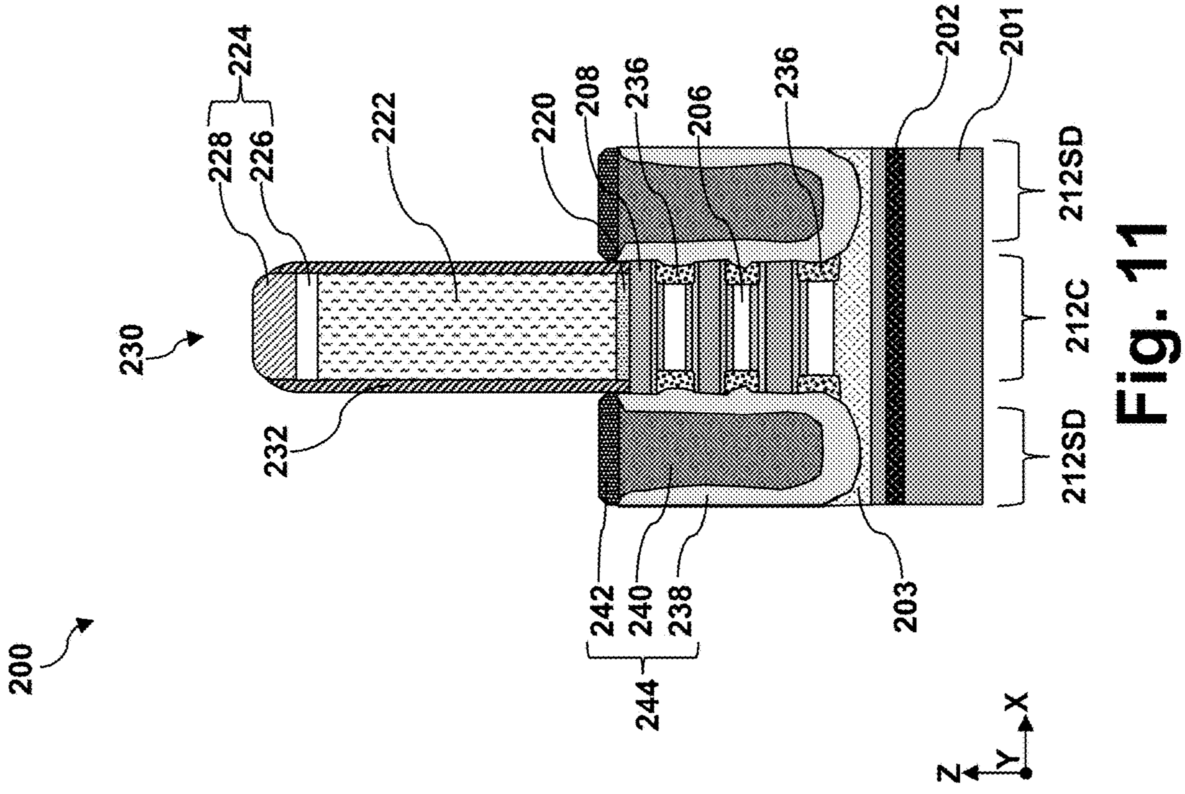

Referring to FIG. 11, the third epitaxial layer 242 is deposited over the second epitaxial layer 240. The third epitaxial layer 242 serves as a capping layer to protect the second epitaxial layer 240 when source/drain contact openings are formed. Therefore, the composition of the third epitaxial layer 242 is selected to be etch resistant. The third epitaxial layer 242 may be formed of silicon-germanium-tin. In other words, the third epitaxial layer 242 may include silicon, germanium and tin. In some instances, to ensure sufficient etch resistance, the third epitaxial layer 242 has a germanium content between about 5% and about 25%, a tin content between about 0% and about 2%, and a silicon content between about 73% and about 95%. It can be seen that the third epitaxial layer 242 includes silicon while the first epitaxial layer 238 and the second epitaxial layer 240 includes little or no silicon. The third epitaxial layer 242 and the first epitaxial layer 238 have the same type of dopant. When an n-type MBC transistor is intended, the third epitaxial layer 242 is doped with an n-type dopant, such as phosphorus (P) or arsenic (As). When a p-type MBC transistor is intended, the third epitaxial layer 242 is doped with a p-type dopant, such as boron (B). In the depicted embodiment, the third epitaxial layer 242 is doped with boron (B). In some instances, the boron dopant concentration in the third epitaxial layer 242 may be between about $1\times10^{20}$ atoms/$cm^3$ and about $5\times10^{20}$ atoms/$cm^3$. This dopant concentration range may be similar to that of the first epitaxial layer 238. In some embodiments, as measured from surfaces of the second epitaxial layer 240, the third epitaxial layer 242 may have a thickness between about 3 nm and about 10 nm. The thickness of the third epitaxial layer 242 is not trivial either. When the thickness of the third epitaxial layer 242 is smaller than 3 nm, the third epitaxial layer 242 may not adequately protect the second epitaxial layer 240. When the thickness of the third epitaxial layer 242 is greater than 10 nm, residual third epitaxial layer 242 may be present in the conduction path to the source/drain contact and increase contact resistance. As shown in FIG. 11, over a source/drain region 212SD, the first epitaxial layer 238, the second epitaxial layer 240, and the third epitaxial layer 242 may be collectively referred to as a source/drain feature 244 throughout the present disclosure.

While not explicitly illustrated, method 100 may include an anneal process after the formation of the source/drain feature 244. In some implementation, the anneal process may include a rapid thermal anneal (RTA) process, a laser spike anneal process, a flash anneal process, or a furnace anneal process. The anneal process may include a peak anneal temperature between about 900° C. and about 1000° C. In these implementations, the peak anneal temperature may be maintained for a duration measured by seconds or microseconds. Through the anneal process a desired electronic contribution of the dopant in the semiconductor host, such as germanium-tin (GeSn), may be obtained. The anneal process may generate vacancies that facilitate movement of the dopant from interstitial sites to substitutional lattice sites and reduce damages or defects in the lattice of the semiconductor host.

Figure 12:
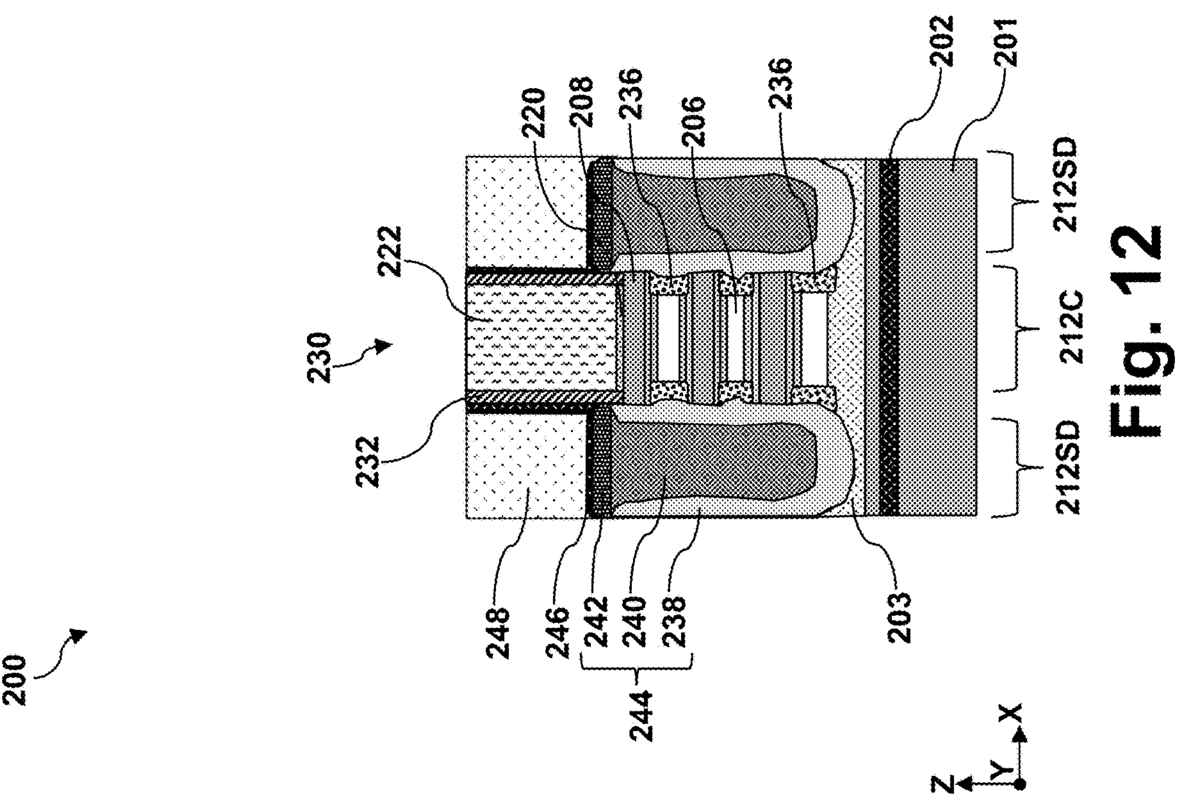

Referring to FIGS. 1 and 12, method 100 includes a block 116 where a contact etch stop layer (CESL) 246 and an interlayer dielectric layer 248 are deposited. The CESL 246 is formed prior to forming the ILD layer 248. In some examples, the CESL 246 includes silicon nitride, silicon oxynitride, and/or other materials known in the art. The CESL 246 may be formed using ALD, plasma-enhanced chemical vapor deposition (PECVD) and/or other suitable deposition processes. The ILD layer 248 is then deposited over the CESL 246. In some embodiments, the ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 248 may be deposited by a PECVD process or other suitable deposition technique. In some embodiments, after formation of the ILD layer 248, the workpiece 200 may be annealed to improve integrity of the ILD layer 248. As shown in FIGS. 12, the CESL 246 may be disposed directly on top surfaces of the third epitaxial layer 242. Referring still to FIG. 12, after the deposition of the CESL 246 and the ILD layer 248, the workpiece 200 may be planarized by a planarization process to expose the dummy gate stack 230. For example, the planarization process may include a chemical mechanical planarization (CMP) process.

Figure 13:
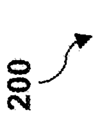
Figure 13:
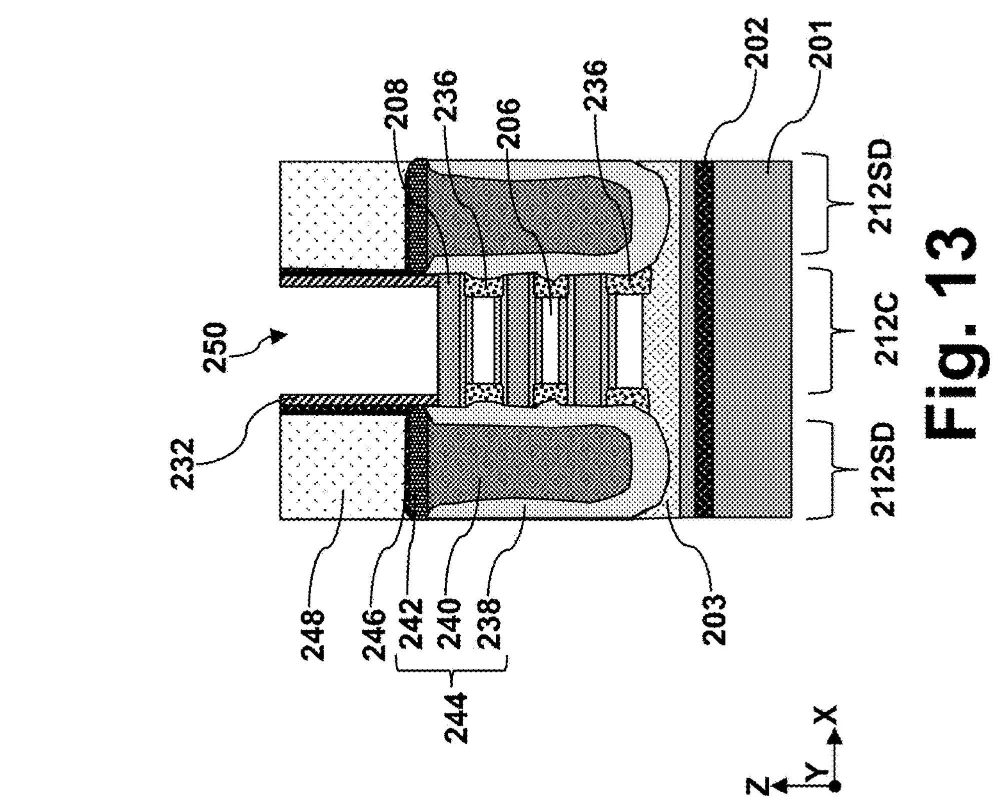

Referring to FIGS. 1 and 13, method 100 includes a block 118 where the dummy gate stack 230 is removed. Exposure of the dummy gate stack 230 at block 116 allows the removal of the dummy gate stack 230 as shown in FIG. 13 and release of the channel layers 208 as illustrated in FIG. 14. In some embodiments, the removal of the dummy gate stack 230 results in a gate trench 250 over the channel regions 212C. The removal of the dummy gate stack 230 may include one or more etching processes that are selective to the material of the dummy gate stack 230. For example, the removal of the dummy gate stack 230 may be performed using as a selective wet etch, a selective dry etch, or a combination thereof that is selective to the dummy gate stack 230. After the removal of the dummy gate stack 230, sidewalls of the channel layers 208, the first cap layers 216, the second cap layers 218, and the sacrificial layers 206 in the channel region 212C are exposed in the gate trench 250.

Referring to FIGS. 1 and 14, method 100 includes a block 120 where the sacrificial layers 206 and the first cap layers 216 are selectively removed to release the channel layers 208 as channel members 2080. Because composition of the sacrificial layers 206 and the first cap layers 216 are similar, when the sacrificial layers 206 are selectively removed, the first cap layers 216 may be removed at the same time. While the selective removal of the sacrificial layers 206 may also remove a portion of the second cap layers 218, due to the composition of the second cap layers 218, a portion of the second cap layers 218 may remain. Because the channel layers 208 is sandwiched between two second cap layers 218 in the stack 204, when the channel layers 208 are released as channel members 2080, each of the channel members 2080 is sandwiched vertically between two second cap layers 218. One of the two second cap layers 218 is disposed directly on a top surface of each of the channel members 2080 and the other of the two second cap layers 218 is disposed directly below and in contact with a bottom surface of each of the channel members 2080. The selective removal of the sacrificial layers 206 and the first cap layers 216 leaves behind space 252 between channel members 2080. The presence of the spaces 252 means that the channel members 2080 extend along the X direction between two source/drain features 244 like suspension bridges. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include use of hydrogen peroxide or an APM etch (e.g., ammonia hydroxide-hydrogen peroxide-water mixture).

Figure 15:
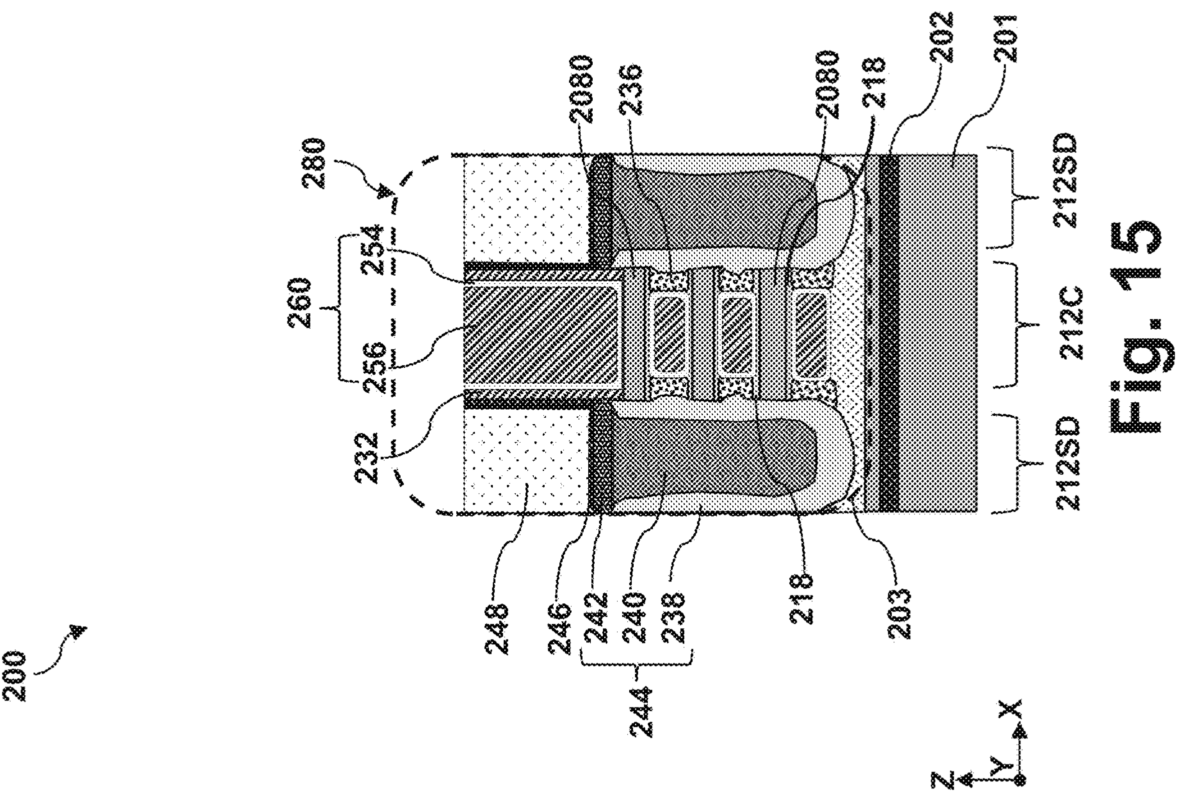

Referring to FIGS. 1 and 15, method 100 includes a block 122 where a gate structure 260 is formed to wrap around each of the channel members 2080. In some embodiments, the gate structure 260 is formed within the gate trench 250 and into the space 252 left behind by the removal of the sacrificial layers 206 and the first cap layers 216. In this regard, the gate structure 260 wraps around each of the channel members 2080. The gate structure 260 includes a gate dielectric layer 254 and a gate electrode layer 256 over the gate dielectric layer 254. In some embodiments, while not explicitly shown in the figures, the gate dielectric layer 254 includes an interfacial layer and a high-k gate dielectric layer. High-k dielectric materials, as used and described herein, include dielectric materials having a high dielectric constant, for example, greater than that of thermal silicon oxide (~3.9). The interfacial layer may include a dielectric material such as silicon oxide, germanium oxide, germanium-tin oxide, hafnium silicate, or silicon oxynitride. The interfacial layer may be formed by chemical oxidation, thermal oxidation, atomic layer deposition (ALD), chemical vapor deposition (CVD), and/or other suitable method. When the interfacial layer is formed using chemical oxidation or thermal oxidation, at least a portion of the residual second cap layers 218 may be consumed. In some extreme examples not explicitly illustrated, all of the residual second cap layers 218 may be consumed. The high-k gate dielectric layer may include hafnium oxide. Alternatively, the high-k gate dielectric layer may include other high-k dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HMO), $(Ba,Sr)TiO_3$ (BST), silicon nitride (SiN), silicon oxynitride (SiON), combinations thereof, or other suitable material. The high-k gate dielectric layer may be formed by ALD, physical vapor deposition (PVD), CVD, oxidation, and/or other suitable methods.

The gate electrode layer 256 of the gate structure 260 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 256 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer 256 may be formed by ALD, PVD, CVD, e-beam evaporation, or other suitable process. In various embodiments, a CMP process may be performed to remove excessive metal, thereby providing a substantially planar top surface of the gate structure 260. The gate structure 260 includes portions that interpose between channel members 2080 in the channel region 212C.

Reference is made to FIG. 15. Upon conclusion of the operations at block 122, a first MBC transistor 280 is substantially formed. The first MBC transistor 280 includes channel members 2080 that are vertically stacked along the Z direction. Each of the channel members 2080 is wrapped around by the gate structure 260. The channel members 2080 extend or are sandwiched between two source/drain features 244 along the X direction. Each of the source/drain features 244 includes the first epitaxial layer 238 in contact with the buffer layer 203 and the channel members 2080, the second epitaxial layer 240 in contact with the first epitaxial layer 238, and the third epitaxial layer 242 in contact with the second epitaxial layer 240. Each of the channel members 2080 is directly sandwiched between two second cap layers 218 as the second cap layers 218 may not be completely removed when the channel layers 208 are released as channel members 2080. Along the Z direction, each of the channel members 2080 is spaced apart from an adjacent inner spacer 236 and the gate structure 260 by one second cap layer 218.

FIGS. 16-19 illustrate alternative embodiments of the present disclosure. In an alternative embodiment illustrated in FIG. 16, the at least one cap layer in the stack 204 includes a first single cap layer 217. In some embodiments, the first single cap layer 217 includes germanium-tin. To allow the first single cap layer 217 to serve functions of both the first cap layer 216 and the second cap layer 218, the first single cap layer 217 has a thickness between about 3 nm and about 15 nm. This thickness range is not trivial. When the thickness of the first single cap layer 217 is less than 3 nm, the first single cap layer 217 may not adequately protect the channel layers 208 from dopant diffusion or over-etching. When the thickness of the first single cap layer 217 is greater than 15 nm, the first single cap layer 217 may take up valuable room for the gate structure 260. In some implementations, the germanium content and tin content in the first single cap layer 217 are uniform through the thickness of the first single cap layer 217. In some alternative implementations, each of the first single cap layers 217 include a tin content gradient. In these embodiments, the deposition of the first single cap layers 217 is controlled such that the tin content in each of the first single cap layers 217 is at its minimum at an interface with an adjacent sacrificial layer 206 and gradually increases toward an interface with an adjacent channel layer 208. Because the etch rate decreases with the tin content, the tin content gradient described above may cause the etch rate of the first single cap layers 217 to gradually decreases toward to the channel layers 208. In one example, the tin content in each of the first single cap layers 217 is about 0.5% near an interface with an adjacent sacrificial layer 206 and gradually increases to about 5% near an interface with an adjacent channel layer 208.

Figure 17:
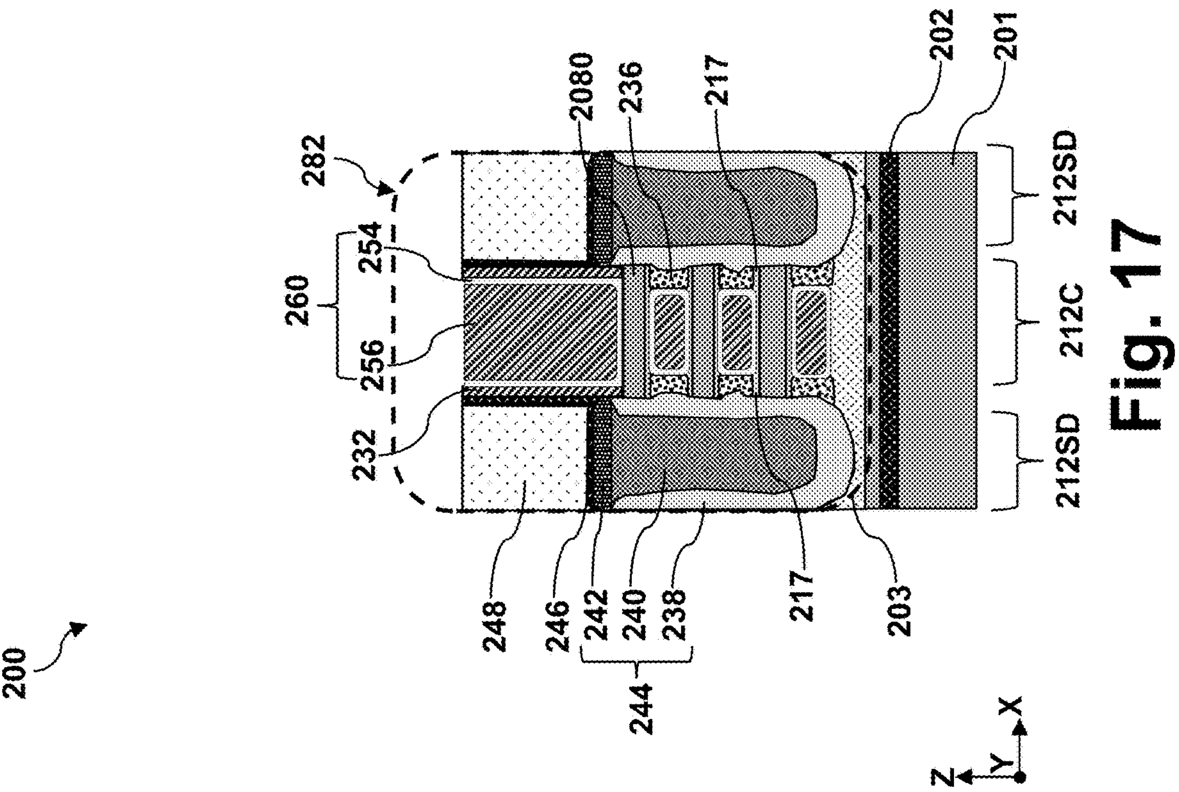
FIG. 17 illustrates an alternative semiconductor structure formed using the alternative semiconductor stack in FIG. 16, according to one or more aspects of the present disclosure.

Reference is now made to FIG. 17. When the stack 204 shown in FIG. 16 is adopted, a second MBC transistor 282 in FIG. 17 may be formed. Like the second cap layers 218, the first single cap layers 217 may not be completely removed from the top surface and the bottom surface of each of the channel members 2080. As a result, each of the channel members 2080 of the second MBC transistor 282 is directly sandwiched between two first single cap layers 217. Because each of the first single cap layers 217 is thicker than each of the second cap layers 218, the residual first single cap layers 217 above and below a channel member 2080 in the second MBC transistor 282 is also thicker. The residual second cap layers 218 in the first MBC transistor 280 may be between about 0.5 nm and about 1 nm while the residual first single cap layer 217 in the second MBC transistor 282 may be between about 1 nm and about 1.5 nm.

In another alternative embodiment illustrated in FIG. 18, the at least one cap layer in the stack 204 includes a second single cap layer 219. In some embodiments, the second single cap layer 219 is formed of undoped germanium (Ge). To allow the second single cap layer 219 to serve functions of both the first cap layer 216 and the second cap layer 218, the second single cap layer 219 has a thickness between about 3 nm and about 15 nm. This thickness range is not trivial. When the thickness of the second single cap layer 219 is less than 3 nm, the second single cap layer 219 may not adequately protect the channel layers 208 from dopant diffusion or over-etching. When the thickness of the second single cap layer 219 is greater than 15 nm, the second single cap layer 219 may take up valuable room for the gate structure 260. The deposition of the layers in the stack 204 may implement process temperatures between about 250° C. and about 400° C. and the thermal energy may cause dopant diffusion from the sacrificial layers 206 into the second single cap layers 219. As a result, in some embodiments, although the second single cap layers 219 are not in-situ doped when they are epitaxially deposited, each of them may include a dopant concentration gradient away from an interface with the adjacent sacrificial 206. That is, the dopant concentration in each of the second single cap layer 219 is at its maximum at the interface with the adjacent sacrificial 206 and gradually decreases with the distance from the interface. As described above, the dopant in the sacrificial layers 206 may be boron (B), phosphorus (P), or arsenic (As) in various embodiments. In those embodiments, a boron concentration gradient, a phosphorus concentration gradient, or an arsenic concentration gradient may be present in each of the second single cap layers 219.

Figure 19:
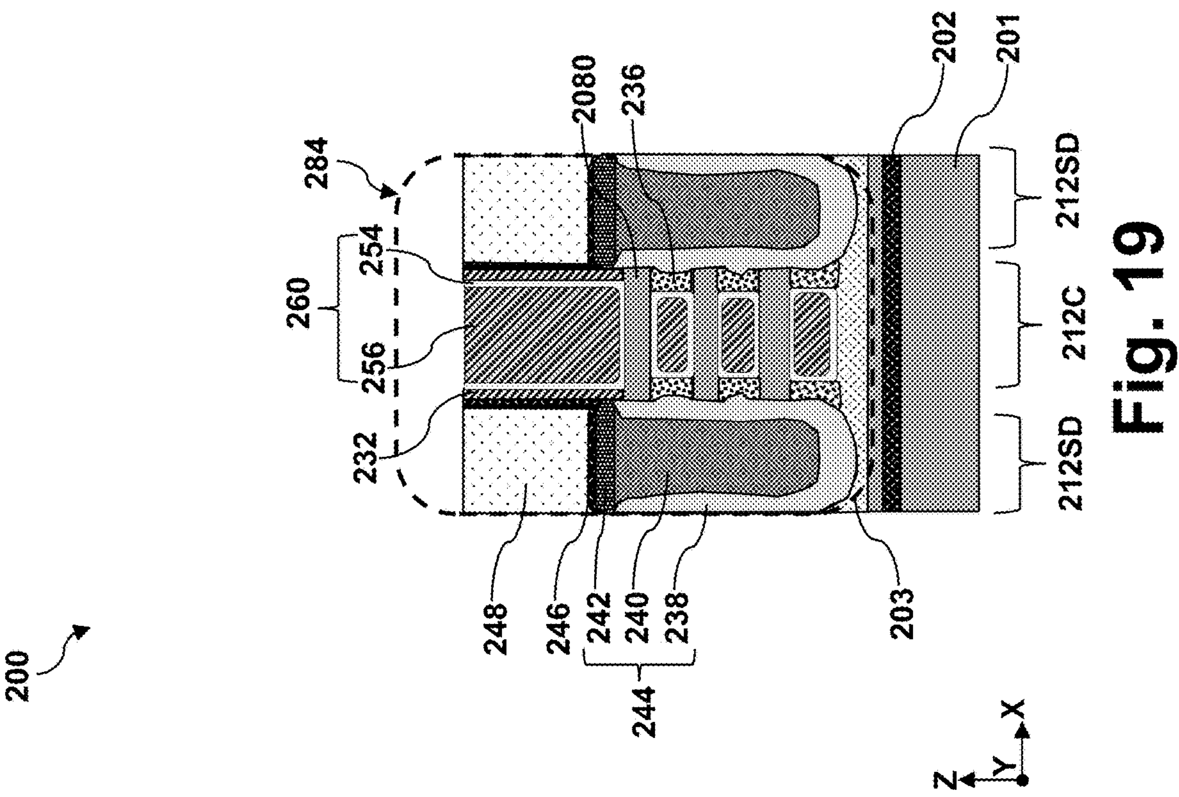
FIG. 19 illustrates an alternative semiconductor structure formed using the alternative semiconductor stack in FIG. 18, according to one or more aspects of the present disclosure.

Reference is now made to FIG. 19. When the stack 204 shown in FIG. 18 is adopted, a third MBC transistor 284 in FIG. 19 may be formed. In some embodiments, the second single cap layers 219 may be completely removed from the top surface and the bottom surface of each of the channel members 2080. As a result, no second single cap layers 219 are present directly above or below each of the channel members 2080 of the third MBC transistor 284. As shown in FIG. 19, the second single cap layers 219 may be completely absent from the third MBC transistor 284. In some other embodiments not explicitly shown in the figures, the second single cap layers 219 includes varying etch resistance through its thickness due to presence of a dopant concentration gradient in the second cap layers 219. In those embodiments, a portion of the second single cap layers 219 may remain in a way similar to the residual first single cap layer 217 shown in FIG. 17.

In one exemplary aspect, the present disclosure is directed to a semiconductor structure. The semiconductor structure includes a plurality of nanostructures disposed over a substrate. Each of the plurality of nanostructures includes a channel layer sandwiched between two cap layers along a direction perpendicular to the substrate and a gate structure wrapping around each of the plurality of nanostructures.

In some embodiments, a composition of the channel layer is different from a composition of the two cap layers. In some implementations, the channel layer and the two cap layers include germanium and tin. In some instances, a first germanium content of the channel layer is smaller than a second germanium content of the two cap layers. In some embodiments, the first germanium content is between about 87% and about 93% and the second germanium content is between about 95% and about 99.5%. In some implementations, a first tin content of the channel layer is greater than a second tin content of the two cap layers. In some instances, the first tin content is between about 7% and about 13% and the second tin content is between about 0.5% and about 5%. In some instances, the semiconductor structure may further include a plurality of inner spacer features interleaving the plurality of nanostructures. Each of the plurality of inner spacer features is spaced apart from the channel layer of one of the plurality of nanostructures by one of the two cap layers along the direction.

In another exemplary aspect, the present disclosure is directed to a semiconductor structure. The semiconductor structure includes a first source/drain feature and a second source/drain feature disposed over a substrate, a plurality of channel members extending between the first source/drain feature and the second source/drain feature, a gate structure wrapping around each of the plurality of channel members. Each of the plurality of channel members includes a semiconductor layer sandwiched between two cap layers along a direction perpendicular to the substrate. The gate structure is in direct contact with the semiconductor layer and the two cap layers of each of the plurality of channel members.

In some embodiments, each of the first source/drain feature and the second source/drain feature is in direct contact with the semiconductor layer and the two cap layers of each of the plurality of channel members. In some embodiments, the semiconductor layer and the two cap layers include germanium and tin. In some implementations, a first germanium content of the semiconductor layer is smaller than a second germanium content of the two cap layers. In some embodiments, a first tin content of the semiconductor layer is greater than a second tin content of the two cap layers. In some embodiments, the first source/drain feature and the second source/drain feature include germanium, tin, boron, phosphorus, or arsenic. In some implementations, the semiconductor structure may further include a germanium buffer layer. The first source/drain feature, the second source/drain feature, and the gate structure are disposed on the germanium buffer layer.

In yet another exemplary aspect, the present disclosure is directed to a method. The method includes depositing a buffer layer over a substrate and forming a stack on the buffer layer. The stack includes a plurality of channel layers, a plurality of sacrificial layers interleaving the plurality of channel layers, and at least one cap layer disposed between each of the plurality of channel layers and an adjacent one of the plurality of sacrificial layers. The method further includes forming a fin-shaped structure from the stack, the buffer layer and the substrate, the fin-shaped structure including a channel region and a source/drain region, forming a dummy gate stack over the channel region of the fin-shaped structure, depositing a gate spacer layer over the dummy gate stack, recessing the source/drain region to form a source/drain trench that exposes sidewalls of the plurality of channel layers and the plurality of sacrificial layers, selectively and partially recessing the plurality of sacrificial layers and a portion of the at least one cap layer to form a plurality of inner spacer recesses, forming a plurality of inner spacer features in the plurality of inner spacer recesses, forming a source/drain feature in the source/drain trench, removing the dummy gate stack, selectively removing the plurality of sacrificial layers to release the plurality of channel layers in the channel region as a plurality of channel members, and forming a gate structure around each of the plurality of channel members. A composition of the at least one cap layer is different from a composition of the plurality of channel layers or a composition of the plurality of sacrificial layers.

In some embodiments, the buffer layer includes germanium, the plurality of channel layers includes germanium-tin or silicon germanium, and the plurality of sacrificial layers includes germanium doped with boron or phosphorus. In some implementations, the at least one cap layer includes a first cap layer in contact with the plurality of sacrificial layers, and a second cap layer in contact with the plurality of channel layers. In some embodiments, the first cap layer includes undoped germanium and the second cap layer includes germanium and tin. In some instances, a germanium content of the second cap layer is between about 95% and about 99.5% and a tin content of the second cap layer is between about 0.5% and about 5%.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
- a substrate;
- a structure extending from the substrate and comprising:
  - a base portion formed from the substrate,
  - a buffer layer disposed over the base portion, and
  - a plurality of nanostructures disposed over the buffer layer, wherein each of the plurality of nanostructures comprises a channel layer sandwiched between two cap layers along a direction perpendicular to the substrate;
- an isolation feature disposed over the substrate and interfacing sidewalls of the base portion and sidewalls of the buffer layer; and
- a gate structure wrapping around each of the plurality of nanostructures,
- wherein the buffer layer comprises undoped germanium.

2. The semiconductor structure of claim 1, wherein a composition of the channel layer is different from a composition of the two cap layers.

3. The semiconductor structure of claim 1, wherein the channel layer and the two cap layers comprise germanium and tin.

4. The semiconductor structure of claim 3, wherein a first germanium content of the channel layer is smaller than a second germanium content of the two cap layers.

5. The semiconductor structure of claim 4,
- wherein the first germanium content is between about 87% and about 93%,
- wherein the second germanium content is between about 95% and about 99.5%.

6. The semiconductor structure of claim 3, wherein a first tin content of the channel layer is greater than a second tin content of the two cap layers.

7. The semiconductor structure of claim 6,
- wherein the first tin content is between about 7% and about 13%,
- wherein the second tin content is between about 0.5% and about 5%.

8. The semiconductor structure of claim 1, further comprising:
- a plurality of inner spacer features interleaving the plurality of nanostructures, wherein each of the plurality of inner spacer features is spaced apart from the channel layer of one of the plurality of nanostructures by one of the two cap layers along the direction.

9. A semiconductor structure, comprising:
- a first source/drain feature and a second source/drain feature disposed over a substrate;
- a plurality of channel members extending between the first source/drain feature and the second source/drain feature, wherein each of the plurality of channel members comprises a semiconductor layer sandwiched between two cap layers along a direction perpendicular to the substrate; and
- a gate structure wrapping around each of the plurality of channel members,
- wherein the gate structure interfaces the two cap layers of each of the plurality of channel members,
- wherein the substrate comprises a buried oxide layer,
- wherein the semiconductor layer and the two cap layers comprise germanium and tin,
- wherein a first germanium content of the semiconductor layer is smaller than a second germanium content of the two cap layers.

10. The semiconductor structure of claim 9, wherein each of the first source/drain feature and the second source/drain feature is in direct contact with the semiconductor layer and the two cap layers of each of the plurality of channel members.

11. The semiconductor structure of claim 9, wherein a first tin content of the semiconductor layer is greater than a second tin content of the two cap layers.

12. The semiconductor structure of claim 9, wherein the first source/drain feature and the second source/drain feature comprise germanium, tin, boron, phosphorus, or arsenic.

13. The semiconductor structure of claim 9, further comprising:
- a germanium buffer layer over the substrate and spaced apart from the buried oxide layer,
- wherein the first source/drain feature, the second source/drain feature, and the gate structure are disposed on the germanium buffer layer.

14. The semiconductor structure of claim 9, further comprising:
- an isolation feature over the substrate, wherein the isolation feature interfaces a sidewall of the buried oxide layer.

15. The semiconductor structure of claim 13, wherein the first source/drain feature and the second source/drain feature partially extend into the germanium buffer layer.

16. A semiconductor structure, comprising:

a substrate;

a buffer layer over the substrate;

a first source/drain feature and a second source/drain feature disposed over the substrate and partially extending into the buffer layer;

a plurality of channel members extending between the first source/drain feature and the second source/drain feature; and a gate structure wrapping around each of the plurality of channel members, wherein at least one of the plurality of channel members comprises a semiconductor layer sandwiched between two cap layers along a direction perpendicular to the substrate, wherein the buffer layer comprises undoped germanium.

17. The semiconductor structure of claim 16, wherein the gate structure interfaces the two cap layers.

18. The semiconductor structure of claim 16, wherein each of the first source/drain feature and the second source/drain feature comprises:

a first epitaxial layer interfacing the plurality of channel members and the buffer layer, and a second epitaxial layer spaced apart from the plurality of channel members and the buffer layer by the first epitaxial layer, and wherein a composition of the first epitaxial layer is different from a composition of the second epitaxial layer.

19. The semiconductor structure of claim 16, wherein the semiconductor layer and the two cap layers comprise germanium and tin.

20. The semiconductor structure of claim 18, wherein a first germanium content of the semiconductor layer is smaller than a second germanium content of the two cap layers, wherein a first tin content of the semiconductor layer is greater than a second tin content of the two cap layers.

* * * * *